(12) United States Patent
Kojima

(10) Patent No.: US 12,272,102 B2
(45) Date of Patent: Apr. 8, 2025

(54) POSITIONING METHOD

(71) Applicant: DISCO CORPORATION, Tokyo (JP)

(72) Inventor: Yoshimasa Kojima, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 167 days.

(21) Appl. No.: 18/331,469

(22) Filed: Jun. 8, 2023

(65) Prior Publication Data

US 2023/0410370 A1 Dec. 21, 2023

(30) Foreign Application Priority Data

Jun. 21, 2022 (JP) ................................. 2022-099554

(51) Int. Cl.
*G06T 7/80* (2017.01)
*G06T 7/70* (2017.01)
(Continued)

(52) U.S. Cl.
CPC ................... *G06T 7/80* (2017.01); *G06T 7/70* (2017.01); *H01L 21/67259* (2013.01);
(Continued)

(58) Field of Classification Search
CPC ......... H01L 21/67242; H01L 21/67259; H01L 21/681; H01L 21/67092; G06T 7/80;
(Continued)

(56) References Cited

U.S. PATENT DOCUMENTS 10,939,598 B2 * 3/2021 Goto ................... H05K 13/0452
12,057,332 B2 * 8/2024 Sun ........................ H01S 5/0265
(Continued)

FOREIGN PATENT DOCUMENTS

JP 2006140341 A 6/2006
JP 2010087141 A 4/2010
JP 5309503 B2 * 10/2013

OTHER PUBLICATIONS

Extended EP Search Report issued in EP 23 17 9210, dated Nov. 15, 2023.

*Primary Examiner* — Tsion B Owens
(74) *Attorney, Agent, or Firm* — Greer Burns & Crain Ltd.

(57) ABSTRACT

A positioning method includes detecting coordinates ($X_{11}$, $Y_{11}$) of a rotation center on a surface of a holding table with a first image capturing unit and stores the detected coordinates as a new first reference position, detecting coordinates ($X_{21}$, $Y_{21}$) of a rotation center on another surface of the holding table with a second image capturing unit and stores the detected coordinates as a new second reference position, calculating a first deviation between a previous rotation center on the surface of the holding table and the coordinates ($X_{11}$, $Y_{11}$), calculating a second deviation between a previous rotation center on the other surface of the holding table and the coordinates ($X_{21}$, $Y_{21}$), correcting a coordinate system of images captured by the first image capturing unit to eliminate the first deviation, and correcting a coordinate system of images captured by the second image capturing unit to eliminate the second deviation.

6 Claims, 20 Drawing Sheets

(51) Int. Cl.
  *H01L 21/67* (2006.01)
  *H04N 23/90* (2023.01)
(52) U.S. Cl.
  CPC ... *H04N 23/90* (2023.01); *G06T 2207/30148* (2013.01); *G06T 2207/30244* (2013.01)
(58) Field of Classification Search
  CPC ............ G06T 7/70; G06T 2207/30148; G06T 2207/30244; H04N 23/90
  See application file for complete search history.

(56) References Cited

U.S. PATENT DOCUMENTS

| | | | |
|---|---|---|---|
| 12,076,879 B2* | 9/2024 | Kojima | B26D 1/15 |
| 12,175,607 B2* | 12/2024 | Spaas | H04N 13/271 |
| 2002/0108239 A1* | 8/2002 | Isogai | H05K 13/089 |
| | | | 29/832 |
| 2016/0136843 A1* | 5/2016 | Katoh | B28D 5/0064 |
| | | | 125/14 |
| 2019/0139208 A1* | 5/2019 | Chen | G06V 10/7515 |
| 2020/0333261 A1 | 10/2020 | Sugiyama et al. | |
| 2022/0028095 A1* | 1/2022 | Bleyer | G06T 19/006 |
| 2022/0115242 A1* | 4/2022 | Jin | H01L 21/0337 |
| 2022/0292719 A1* | 9/2022 | Li | G06T 7/85 |
| 2023/0075297 A1* | 3/2023 | Brauer | G06T 7/70 |
| 2023/0410370 A1* | 12/2023 | Kojima | H01L 21/67242 |

* cited by examiner

POSITIONING METHOD

BACKGROUND OF THE INVENTION

Field of the Invention

The present invention relates to a positioning method of positioning respective reference positions of two image capturing units in a processing apparatus and a method of updating respective reference positions of two image capturing units in a processing apparatus.

Description of the Related Art

Electronic appliances including cellular phones, personal computers, etc., incorporate device chips. Device chips are manufactured from a monocrystalline substrate or wafer of silicon. For example, devices such as integrated circuits (ICs) are constructed in respective rectangular areas demarcated on the face side of a wafer by a grid of projected dicing lines, and then the wafer is divided along the projected dicing lines into individual device chips by such a processing apparatus as a cutting apparatus.

To catch up with the diversification of devices in recent years, there has been developed a processing method of processing a wafer having devices constructed thereon while holding the face side that faces downwardly of the wafer under suction on a chuck table (see, for example, Japanese Patent Laid-open No. 2006-140341). To reduce the proposed processing method to practice, there has also been proposed a processing apparatus having image capturing units disposed respectively above and below a chuck table (see, for example, Japanese Patent Laid-open No. 2010-87141).

The two image capturing units disposed on both sides of the chuck table make it possible to confirm whether or not an oblique cut has occurred in a wafer when the wafer is cut. The oblique cut refers to a situation in which an annular cutting blade cuts into the wafer obliquely to thicknesswise directions of the wafer. An oblique cut in a wafer can be detected by detection of the positional shift between the position of a first kerf formed in the upper surface, i.e., the reverse side, of the wafer in an image captured by the upper image capturing unit and the position of a second kerf formed in the lower surface, i.e., the face side, of the wafer in an image captured by the lower image capturing unit.

In order to accurately specify the positions of the first and second kerfs that are spaced along the thicknesswise directions of the wafer, it is necessary that the reference position of the upper image capturing unit and the reference position of the lower image capturing unit be coincident with each other on a horizontal XY plane perpendicular to a Z-axis parallel to the thicknesswise directions of the wafer. The reference positions are established on the rotation center of the chuck table, for example. However, the reference position of the upper image capturing unit and the reference position of the lower image capturing unit may slightly deviate from each other on the XY plane because the relative positional relation between the upper and lower image capturing units tends to vary due to the heat generated when the processing apparatus is in use. In a processing apparatus having two upper image capturing units disposed above a chuck table, the reference positions of the two upper image capturing units may also slightly deviate from each other on the XY plane due to the heat generated when the processing apparatus is in use.

SUMMARY OF THE INVENTION

The present invention has been devised in view of the above problems. It is an object of the present invention to reduce a positional deviation on a horizontal XY plane between the respective reference positions of two image capturing units.

In accordance with an aspect of the present invention, there is provided a positioning method of positioning a reference position of a first image capturing unit and a reference position of a second image capturing unit with respect to each other in a processing apparatus, the processing apparatus including a holding table that has a region made of a transparent material and that is capable of holding a workpiece under suction thereon, the holding table being rotatable about a predetermined rotational axis, the first image capturing unit disposed on the side of a surface of the holding table, and the second image capturing unit disposed on the side of another surface of the holding table, the rotational axis extending along a Z-axis perpendicular to an XY plane, the positioning method including a first storing step of detecting coordinates $(X_{10}, Y_{10})$ of a rotation center on the side of the surface of the holding table with the first image capturing unit and storing the detected coordinates as a first reference position, a second storing step of detecting coordinates $(X_{20}, Y_{20})$ of a rotation center on the side of the other surface of the holding table, the coordinates $(X_{20}, Y_{20})$ corresponding to the coordinates $(X_{10}, Y_{10})$ on the XY plane, with the second image capturing unit and storing the detected coordinates as a second reference position, after the first storing step and the second storing step, a third storing step of detecting coordinates $(X_{11}, Y_{11})$ of a rotation center on the side of the surface of the holding table with the first image capturing unit and storing the detected coordinates as a new first reference position, after the first storing step and the second storing step, a fourth storing step of detecting coordinates $(X_{21}, Y_{21})$ of a rotation center on the side of the other surface of the holding table with the second image capturing unit and storing the detected coordinates as a new second reference position, after the third storing step and the fourth storing step, a first deviation calculating step of calculating a first deviation between the coordinates $(X_{10}, Y_{10})$ and the coordinates $(X_{11}, Y_{11})$, after the third storing step and the fourth storing step, a second deviation calculating step of calculating a second deviation between the coordinates $(X_{20}, Y_{20})$ and the coordinates $(X_{21}, Y_{21})$, a first correcting step of correcting a coordinate system of images captured by the first image capturing unit, in order to eliminate the first deviation, and a second correcting step of correcting a coordinate system of images captured by the second image capturing unit, in order to eliminate the second deviation.

In accordance with another aspect of the present invention, there is provided a positioning method of positioning a reference position of a first image capturing unit and a reference position of a second image capturing unit with respect to each other in a processing apparatus, the processing apparatus including a holding table that has a region made of a transparent material and that is capable of holding a workpiece under suction thereon, the holding table being rotatable about a predetermined rotational axis, the first image capturing unit disposed on the side of a surface of the holding table, and the second image capturing unit disposed on the side of another surface of the holding table, the rotational axis extending along a Z-axis perpendicular to an XY plane, the positioning method including a third storing step of detecting coordinates $(X_{11}, Y_{11})$ of a rotation center on the side of the surface of the holding table with the first image capturing unit and storing the detected coordinates as a new first reference position, a fourth storing step of detecting coordinates $(X_{21}, Y_{21})$ of a rotation center on the side of the other surface of the holding table with the second image capturing unit and storing the detected coordinates as a new second reference position, after the third storing step and the fourth storing step, a first deviation calculating step of calculating a first deviation between coordinates ($X_{10}$, $Y_{10}$) of a rotation center on the side of the surface of the holding table that have been detected with the first image capturing unit and stored in advance as a first reference position in the processing apparatus and the coordinates ($X_{11}$, $Y_{11}$), after the third storing step and the fourth storing step, a second deviation calculating step of calculating a second deviation between coordinates ($X_{20}$, $Y_{20}$) of a rotation center on the side of the other surface of the holding table that have been detected with the second image capturing unit and stored in advance as a second reference position in the processing apparatus, the coordinates ($X_{20}$, Yeo) corresponding to the coordinates ($X_{10}$, $Y_{10}$) on the XY plane, and the coordinates ($X_{21}$, $Y_{21}$), a first correcting step of correcting a coordinate system of images captured by the first image capturing unit, in order to eliminate the first deviation, and a second correcting step of correcting a coordinate system of images captured by the second image capturing unit, in order to eliminate the second deviation.

In accordance with a further aspect of the present invention, there is provided a positioning method of positioning a reference position of a third image capturing unit and a reference position of a fourth image capturing unit with respect to each other in a processing apparatus, the processing apparatus including a holding table that has a region made of a transparent material and that is capable of holding a workpiece under suction thereon, the holding table being rotatable about a predetermined rotational axis, and the third and fourth image capturing units disposed the side of a surface of the holding table in thicknesswise directions of the holding table, the rotational axis extending along a Z-axis perpendicular to an XY plane, the positioning method including a first storing step of detecting coordinates ($X_{30}$, $Y_{30}$) of a rotation center on the side of the surface of the holding table with the third image capturing unit and storing the detected coordinates as a third reference position, a second storing step of detecting coordinates ($X_{40}$, $Y_{40}$) of a rotation center on the side of the surface of the holding table, the coordinates ($X_{40}$, $Y_{40}$) corresponding to the coordinates ($X_{30}$, $Y_{30}$) on the XY plane, with the fourth image capturing unit and storing the detected coordinates as a fourth reference position, after the first storing step and the second storing step, a third storing step of detecting coordinates ($X_{31}$, $Y_{31}$) of a rotation center on the side of the surface of the holding table with the third image capturing unit and storing the detected coordinates as a new third reference position, after the first storing step and the second storing step, a fourth storing step of detecting coordinates ($X_{41}$, $Y_{41}$) of a rotation center on the side of the surface of the holding table with the fourth image capturing unit and storing the detected coordinates as a new fourth reference position, after the third storing step and the fourth storing step, a first deviation calculating step of calculating a first deviation between the coordinates ($X_{30}$, $Y_{30}$) and the coordinates ($X_{31}$, $Y_{31}$), after the third storing step and the fourth storing step, a second deviation calculating step of calculating a second deviation between the coordinates ($X_{40}$, $Y_{40}$) and the coordinates ($X_{41}$, $Y_{41}$), a first correcting step of correcting a coordinate system of images captured by the third image capturing unit, in order to eliminate the first deviation, and a second correcting step of correcting a coordinate system of images captured by the fourth image capturing unit, in order to eliminate the second deviation.

In accordance with a still further aspect of the present invention, there is provided a positioning method of positioning a reference position of a third image capturing unit and a reference position of a fourth image capturing unit with respect to each other in a processing apparatus, the processing apparatus including a holding table that has a region made of a transparent material and that is capable of holding a workpiece under suction thereon, the holding table being rotatable about a predetermined rotational axis, and the third and fourth image capturing units disposed on the side of a surface of the holding table in thicknesswise directions of the holding table, the rotational axis extending along a Z-axis perpendicular to an XY plane, the positioning method including a third storing step of detecting coordinates ($X_{31}$, $Y_{31}$) of a rotation center on the side of the surface of the holding table with the third image capturing unit and storing the detected coordinates as a new third reference position, a fourth storing step of detecting coordinates ($X_{41}$, $Y_{41}$) of a rotation center on the side of the surface of the holding table with the fourth image capturing unit and storing the detected coordinates as a new fourth reference position, after the third storing step and the fourth storing step, a first deviation calculating step of calculating a first deviation between coordinates ($X_{30}$, $Y_{30}$) of a rotation center on the side of the surface of the holding table that have been detected with the third image capturing unit and stored in advance as a third reference position in the processing apparatus and the coordinates ($X_{31}$, $Y_{31}$), after the third storing step and the fourth storing step, a second deviation calculating step of calculating a second deviation between coordinates ($X_{40}$, $Y_{40}$) of a rotation center on the side of the surface of the holding table that have been detected with the fourth image capturing unit and stored in advance as a fourth reference position in the processing apparatus, the coordinates ($X_{40}$, $Y_{40}$) corresponding to the coordinates ($X_{30}$, $Y_{30}$) on the XY plane, and the coordinates ($X_{41}$, $Y_{41}$), a first correcting step of correcting a coordinate system of images captured by the third image capturing unit, in order to eliminate the first deviation, and a second correcting step of correcting a coordinate system of images captured by the fourth image capturing unit, in order to eliminate the second deviation.

In accordance with a yet further aspect of the present invention, there is provided an updating method of updating a reference position of a first image capturing unit and a reference position of a second image capturing unit in a processing apparatus, the processing apparatus including a holding table that has a region made of a transparent material and that is capable of holding a workpiece under suction thereon, the holding table being rotatable about a predetermined rotational axis, the first image capturing unit disposed on the side of a surface of the holding table, and the second image capturing unit disposed on the side of another surface of the holding table, the rotational axis extending along a Z-axis perpendicular to an XY plane, the updating method including a first storing step of detecting coordinates ($X_{10}$, $Y_{10}$) of a rotation center on the side of the surface of the holding table with the first image capturing unit and storing the detected coordinates as a first reference position, a second storing step of detecting coordinates ($X_{20}$, $Y_{20}$) of a rotation center on the side of the other surface of the holding table, the coordinates ($X_{20}$, $Y_{20}$) corresponding to the coordinates ($X_{10}$, $Y_{10}$) on the XY plane, with the second image capturing unit and storing the detected coordinates as a second reference position, after the first storing step and the second storing step, a third storing step of detecting coordinates ($X_{11}$, $Y_{11}$) of a rotation center on the side of the surface of the holding table with the first image capturing unit, updating the coordinates $(X_{10}, Y_{10})$ into the coordinates $(X_{11}, Y_{11})$, and storing the coordinates $(X_{11}, Y_{11})$ as the first reference position, and after the first storing step and the second storing step, a fourth storing step of detecting coordinates $(X_{21}, Y_{21})$ of a rotation center on the side of the other surface of the holding table with the second image capturing unit, updating the coordinates $(X_{20}, Y_{20})$ into the coordinates $(X_{21}, Y_{21})$, and storing the coordinates $(X_{21}, Y_{21})$ as the second reference position.

In accordance with a yet still further aspect of the present invention, there is provided an updating method of updating a reference position of a third image capturing unit and a reference position of a fourth image capturing unit in a processing apparatus, the processing apparatus including a holding table that has a region made of a transparent material and that is capable of holding a workpiece under suction thereon, the holding table being rotatable about a predetermined rotational axis, and the third and fourth image capturing units disposed on the side of a surface of the holding table in thicknesswise directions of the holding table, the rotational axis extending along a Z-axis perpendicular to an XY plane, the updating method including a first storing step of detecting coordinates $(X_{30}, Y_{30})$ of a rotation center on the side of the surface of the holding table with the third image capturing unit and storing the detected coordinates as a third reference position, a second storing step of detecting coordinates $(X_{40}, Y_{40})$ of a rotation center on the side of the surface of the holding table, the coordinates $(X_{40}, Y_{40})$ corresponding to the coordinates $(X_{30}, Y_{30})$ on the XY plane, with the fourth image capturing unit and storing the detected coordinates as a fourth reference position, after the first storing step and the second storing step, a third storing step of detecting coordinates $(X_{31}, Y_{31})$ of a rotation center on the side of the surface of the holding table with the third image capturing unit, updating the coordinates $(X_{30}, Y_{30})$ into the coordinates $(X_{31}, Y_{31})$, and storing the coordinates $(X_{31}, Y_{31})$ as the third reference position, and after the first storing step and the second storing step, a fourth storing step of detecting coordinates $(X_{41}, Y_{41})$ of a rotation center on the side of the surface of the holding table with the fourth image capturing unit, updating the coordinates $(X_{40}, Y_{40})$ into the coordinates $(X_{41}, Y_{41})$, and storing the coordinates $(X_{41}, Y_{41})$ as the fourth reference position.

In the positioning methods according to the aspect and other aspect of the present invention, the first deviation is calculated between the coordinates $(X_{10}, Y_{10})$, i.e., the first reference position, of the rotation center on the side of the surface of the holding table that have been detected with the first image capturing unit and the coordinates $(X_{11}, Y_{11})$, i.e., the new first reference position, of the rotation center that has been detected with the first image capturing unit after the first reference position has been acquired. Then, the coordinate system of the first image capturing unit is corrected in order to eliminate the first deviation between the first reference position and the new first reference position of the first image capturing unit.

Similarly, the second deviation is calculated between the coordinates $(X_{20}, Y_{20})$, i.e., the second reference position, of the rotation center on the side of the other surface of the holding table that have been detected with the second image capturing unit and the coordinates $(X_{21}, Y_{21})$, i.e., the new second reference position, of the rotation center that has been detected with the second image capturing unit after the second reference position has been acquired. Then, the coordinate system of the second image capturing unit is corrected in order to eliminate the second deviation between the second reference position and the new second reference position of the second image capturing unit.

The rotational axis of the holding table extends along the Z-axis, and the coordinates $(X_{11}, Y_{11})$ of the rotation center on the side of the surface of the holding table and the coordinates $(X_{21}, Y_{21})$ of the rotation center on the side of the other surface of the holding table correspond to each other on the XY plane. Thus, providing the reference position of the first image capturing unit is represented by the coordinates $(X_{11}, Y_{11})$ and the reference position of the second image capturing unit is represented by the coordinates $(X_{21}, Y_{21})$, the deviation between the reference positions on the XY plane can be reduced. For example, these reference positions can be coincident with each other on the XY plane.

Similarly, the positioning methods according to the further and still further aspects of the present invention can reduce the deviation on the XY plane between the coordinates $(X_{31}, Y_{31})$, i.e., the third reference position, and the coordinates $(X_{41}, Y_{41})$, i.e., the fourth reference position, can be reduced. For example, these reference positions can be coincident with each other on the XY plane.

In the reference position updating method according to the yet further aspect of the present invention, the first reference position of the first image capturing unit is updated from the coordinates $(X_{10}, Y_{10})$ into the coordinates $(X_{11}, Y_{11})$, and the coordinates $(X_{11}, Y_{11})$ are stored, and the second reference position of the second image capturing unit is updated from the coordinates $(X_{20}, Y_{20})$ into the coordinates $(X_{21}, Y_{21})$, and the coordinates $(X_{21}, Y_{21})$ are stored. As the coordinates $(X_{11}, Y_{11})$ and the coordinates $(X_{21}, Y_{21})$ correspond to, e.g., are coincident with, each other on the XY plane, even if the relative positional relation between the two image capturing units deviates, the deviation on the XY plane between the reference positions of the two image capturing units can be reduced when the old reference positions are updated into the new reference positions. For example, the reference positions can be coincident with each other on the XY plane.

In the reference position updating method according to the yet still further aspect of the present invention, the third reference position of the third image capturing unit is updated from the coordinates $(X_{30}, Y_{30})$ into the coordinates $(X_{31}, Y_{31})$, and the coordinates $(X_{31}, Y_{31})$ are stored, and the fourth reference position of the fourth image capturing unit is updated from the coordinates $(X_{40}, Y_{40})$ into the coordinates $(X_{41}, Y_{41})$, and the coordinates $(X_{41}, Y_{41})$ are stored. As the coordinates $(X_{31}, Y_{31})$ and the coordinates $(X_{41}, Y_{41})$ correspond to, e.g., are coincident with, each other on the XY plane, even if the relative positional relation between the two image capturing units deviates, the deviation on the XY plane between the reference positions of the two image capturing units can be reduced when the old reference positions are updated into the new reference positions. For example, the reference positions can be coincident with each other on the XY plane.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described below with reference to the accompanying drawings.

First Embodiment

Figure 1:
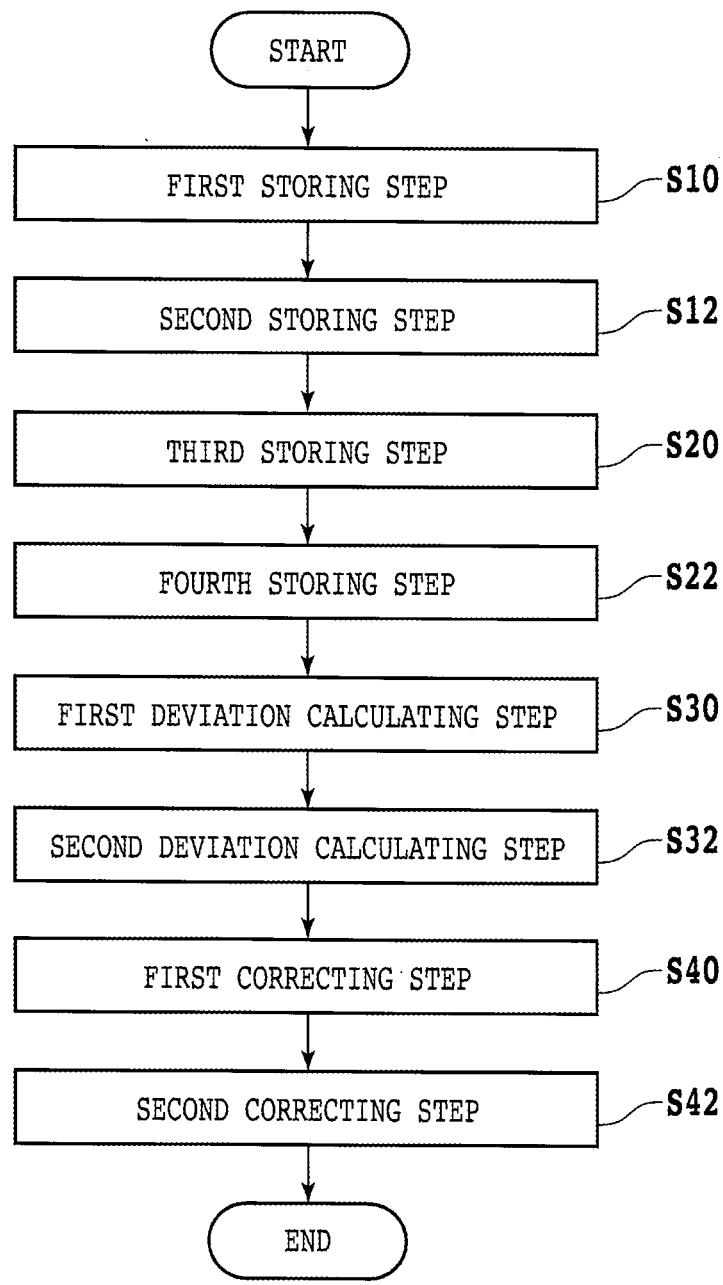
FIG. 1 is a flowchart of a positioning method according to a first embodiment of the present invention.

According to a first embodiment, a positioning method of positioning the reference position of an upper image capturing unit, also referred to as a first image capturing unit, 84a (see FIG. 2) of a cutting apparatus, also referred to as a processing apparatus, 2 and the reference position of a first lower image capturing unit, also referred to as a second image capturing unit, 56 (see FIG. 7) coincident with each other will be described below with reference to FIG. 1. FIG. 1 is a flowchart of the positioning method according to the first embodiment. The positioning method according to the first embodiment is carried out on the cutting apparatus 2 illustrated in FIG. 2. The cutting apparatus 2 illustrated in FIG. 2 will first be described below.

Figure 2:
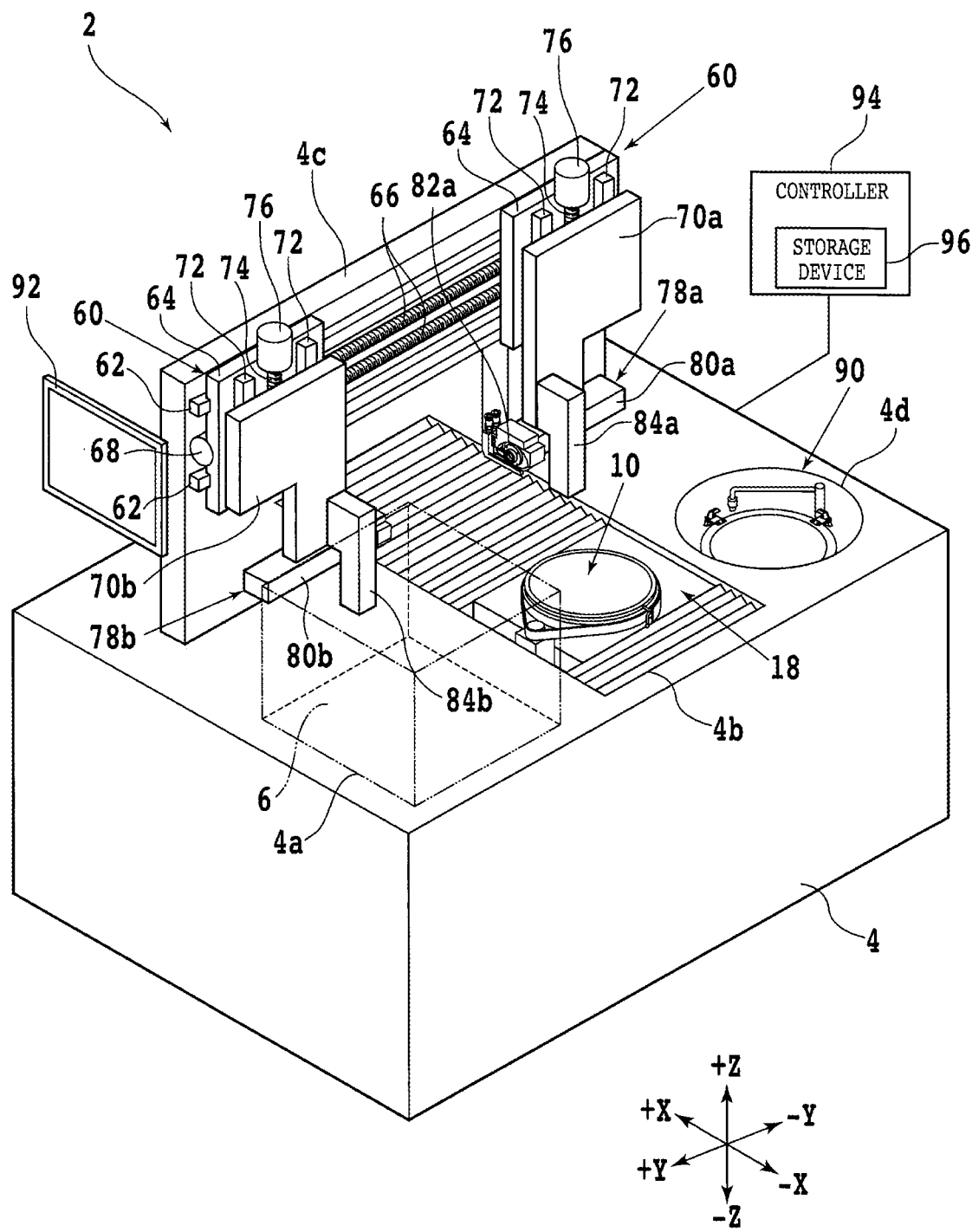
FIG. 2 is a perspective view of a cutting apparatus on which the positioning method according to the first embodiment is carried out.

FIG. 2 illustrates the cutting apparatus 2 in perspective. In FIG. 2, some components are illustrated in block form. In FIG. 2, the cutting apparatus 2 is illustrated in a three-dimensional coordinate system having an X-axis, a Y-axis, and a Z-axis that extend perpendicularly to each other. The X-axis and the Y-axis extend horizontally perpendicularly to each other and jointly define a horizontal XY plane, and the Z-axis extends vertically perpendicularly to the X-axis and the Y-axis and hence to the XY plane. A +X direction and a −X direction that are indicated respectively by an arrow +X and an arrow −X extend parallel to the X-axis, and a +Y direction and a −Y direction that are indicated respectively by an arrow +Y and an arrow −Y extend parallel to the Y-axis. A +Z direction and a −Z direction that are indicated respectively by an arrow +Z and an arrow −Z extend parallel to the Z-axis. The +X direction and the −X direction are also referred to as processing-feed directions, and the +Y direction and the −Y direction are also referred to as indexing-feed directions. The +Z direction and the −Z direction are also referred to as heightwise directions or vertical directions.

The cutting apparatus 2 has a base block 4 shaped as a rectangular parallelepiped that supports various components of the cutting apparatus 2 within itself and on its upper surface. The base block 4 has a square opening 4a that is defined therein at a corner thereof and that is open in its upper surface. The opening 4a houses therein an unillustrated cassette elevator for supporting on its upper surface a cassette 6 that houses therein a plurality of workpieces 11 (see FIG. 3) or workpiece units 21 to be more precise, as described later in detail with reference to FIG. 3.

The workpiece 11 includes a monocrystalline substrate or wafer shaped as a circular plate made of a semiconductor material such as silicon (Si) or silicon carbide (SiC). According to the present invention, however, the workpiece 11 is not necessarily limited to any shape, material, structure, size, etc. The workpiece 11 may include a substrate made of any of other semiconductors, ceramics, resin, metal, etc.

Figure 3:
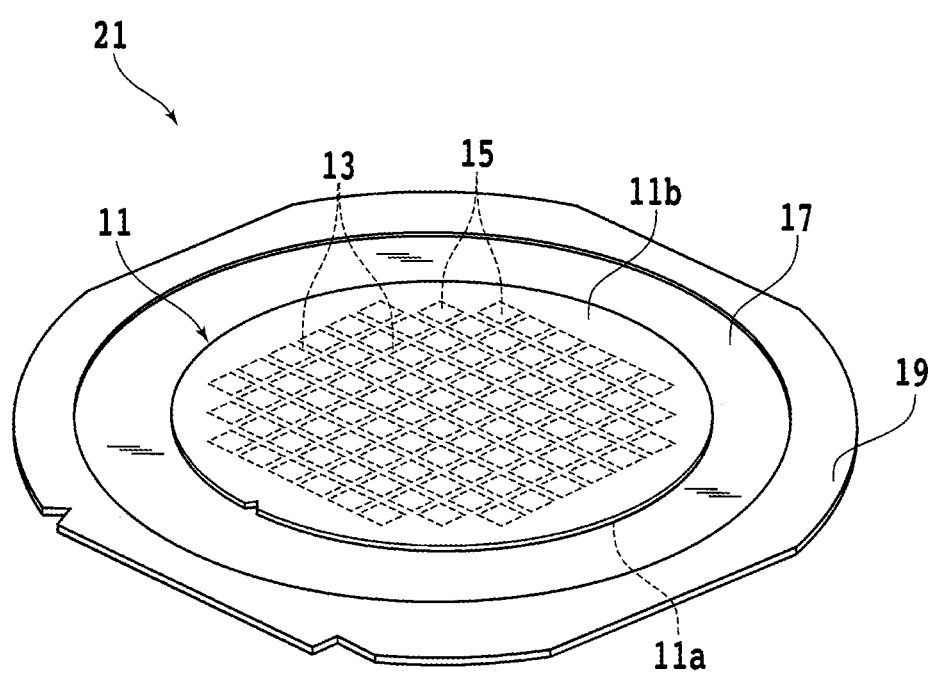
FIG. 3 is a perspective view of a workpiece unit.

As illustrated in FIG. 3, the workpiece 11 has a grid of projected dicing lines 13 established on a face side 11a thereof that demarcate a plurality of areas where devices 15 such as ICs and unillustrated alignment marks are formed. A circular tape, referred to as a dicing tape, 17 that is larger in diameter than the workpiece 11 is affixed to the face side 11a that faces downwardly.

The tape 17 has a layered structure including a base layer and an adhesive layer, i.e., a glue layer, that are made of transparent materials through which electromagnetic waves in predetermined wavelength bands such as visible light and infrared radiation are transmittable. Specifically, the base layer is made of polyolefin (PO) or the like, for example. The adhesive layer is made of adhesive resin such as ultraviolet (UV)-curable acrylic resin, for example. The face side 11a of the workpiece 11 is affixed to a central portion of the tape 17. The tape 17 has an outer circumferential portion to which a surface of an annular frame 19 of metal is affixed. The workpiece 11, the tape 17 affixed to the workpiece 11, and the annular frame 19 affixed to the tape 17 jointly make up a workpiece unit 21 where the workpiece 11 is supported on the frame 19 by the tape 17.

FIG. 3 illustrates the workpiece unit 21 in perspective. The workpiece unit 21 is housed in the cassette 6 such that a reverse side 11b of the workpiece 11 that is opposite the face side 11a thereof is exposed. As illustrated in FIG. 2, the base block 4 also has an oblong rectangular opening 4b that is defined behind the opening 4a in the −Y direction and that has longer sides extending along the X-axis. A chuck table, i.e., a holding table, 10 shaped as a circular plate is disposed in the opening 4b.

Figure 4:
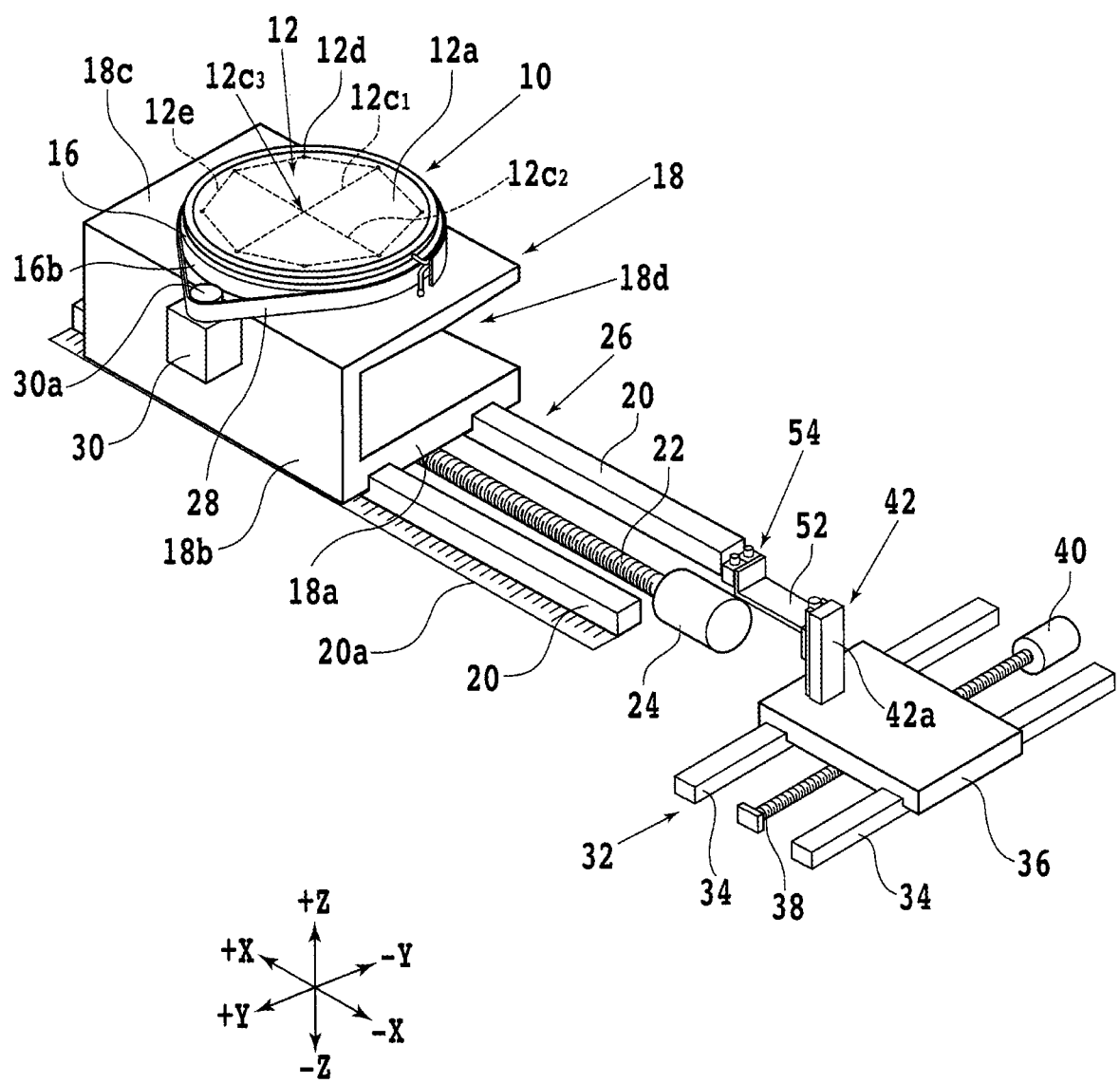
FIG. 4 is a perspective view of a chuck table.
Figure 5:
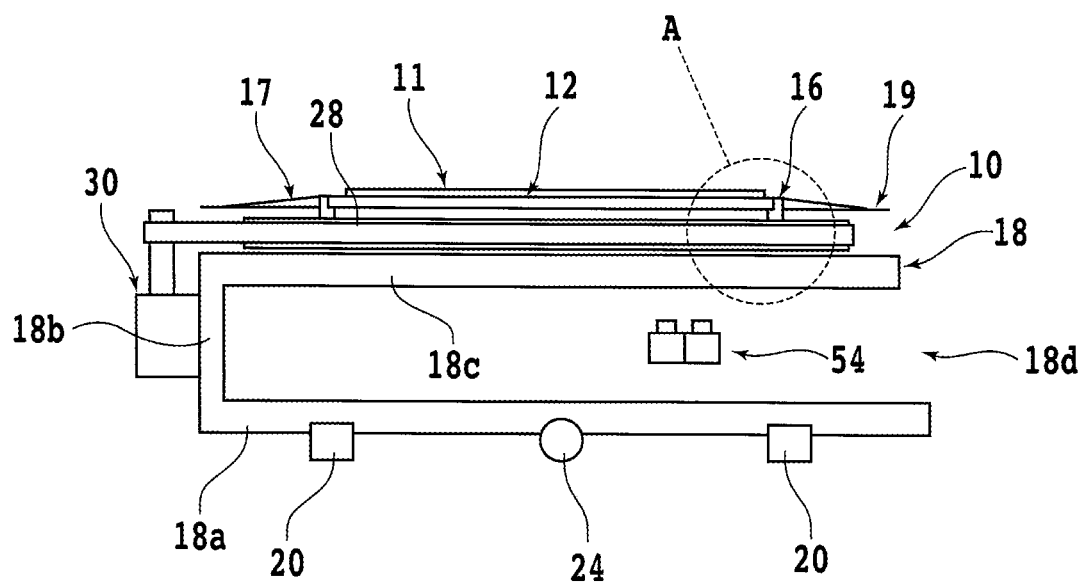
FIG. 5 is a side elevational view, partly in cross section, of the chuck table.
Figure 5:
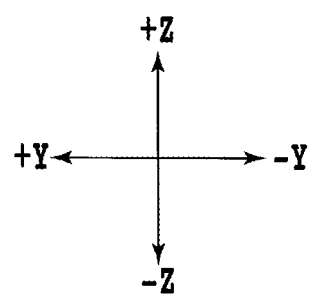
Figure 6:
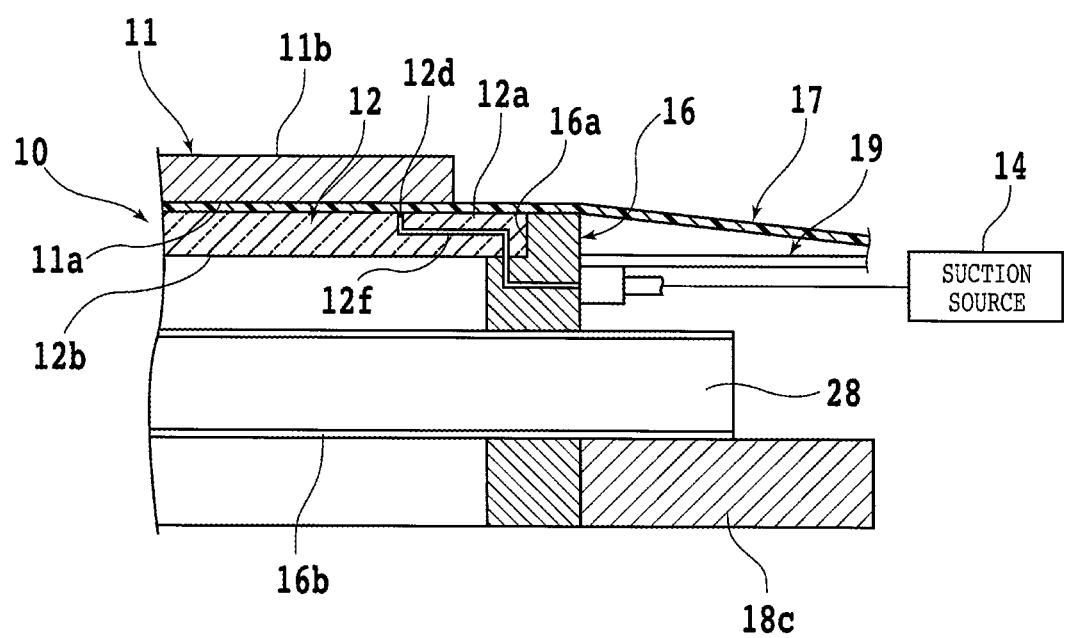
FIG. 6 is an enlarged view of an encircled section A illustrated in FIG. 5.

The chuck table 10 and structural details thereof as well as other peripheral components associated therewith will be described in detail below with reference to FIGS. 4 through 7. An unillustrated annular suction plate having a plurality of suction ports defined therein along the circumferential directions thereof is disposed on an outer circumferential portion of the chuck table 10. FIG. 4 illustrates the chuck table 10 in perspective. FIG. 5 illustrates the chuck table 10 in side elevation, partly in cross section. In FIG. 5, hatching is omitted from illustration for the sake of convenience. FIG. 6 illustrates an encircled section A in FIG. 5 in enlarged cross section. In FIG. 6, a component is illustrated in block form.

The chuck table 10 has a holding member 12 shaped as a circular plate. The holding member 12 includes a substantially flat surface 12a and another substantially flat surface 12b positioned opposite the surface 12a (see FIG. 6). The holding member 12 is made of a transparent material that transmits visible light and infrared rays, e.g., near infrared rays, therethrough. The holding member 12 is, for example, made of quartz glass, borosilicate glass, or soda glass, though it may be made of calcium fluoride, lithium fluoride, or magnesium fluoride.

The holding member 12 has a plurality of fluid channels defined therein. Specifically, the fluid channels include a straight first suction channel 12c1 extending diametrically across the holding member 12 through the central axis of the circular plate thereof, as viewed in plan along the Z-axis, and a straight second suction channel 12c2 extending diametrically across the holding member 12 through the central axis of the circular plate thereof perpendicularly to the first suction channel 12c1 in a plane substantially parallel to the surface 12a. The first suction channel 12c1 and the second suction channel 12c2 are connected to each other at a point 12c3 positioned at the central axis of the circular plate, as viewed in plan along the Z-axis. The holding member 12 also has a plurality of openings 12d defined in an outer circumferential portion thereof at circumferentially spaced intervals. The openings 12d have upper ends open at the surface 12a and extend from the surface 12a to a predetermined depth in the holding member 12 where the openings 12d terminate short of the other surface 12b.

In the example illustrated in FIG. 4, eight openings 12d are disposed at substantially equal spaced intervals in the circumferential directions of the holding member 12. Four out of the eight openings 12d are positioned respectively at the opposite ends of the first suction channel 12c1 and the second suction channel 12c2, as viewed in plan along the Z-axis. The openings 12d are interconnected by an outer circumferential suction channel 12e defined in an outer circumferential portion of the holding member 12 at a predetermined depth. The openings 12d are also connected to a suction channel 12f (see FIG. 6) defined in the holding member 12 and extending radially outwardly. A suction source 14 (see also FIG. 6) such as a vacuum pump is connected to the suction channel 12f.

When the suction source 14 is actuated, it generates negative pressure that acts in the openings 12d through the suction channel 12f. Thus, the surface 12a of the holding member 12 where the openings 12d are open functions as a holding surface for holding the workpiece unit 21, i.e., the workpiece 11, under suction thereon. The fluid channels in the holding member 12, which include the first suction channel 12c1, the second suction channel 12c2, the openings 12d, the outer circumferential suction channel 12e, and the suction channel 12f, disperse or reflect light that is applied to the holding member 12.

Hence, the fluid channels in the holding member 12 as they are viewed from the surface 12a or the other surface 12b may not be completely transparent to visible light, and may be transmissive of light or may be opaque to light. However, regions of the holding member 12 except these fluid channels are transparent from the surface 12a to the other surface 12b. Specifically, four regions of the holding member 12 that are divided by the first suction channel 12c1 and the second suction channel $12c_2$ and that are positioned radially inwardly of the outer circumferential suction channel 12e are transparent from the surface 12a to the other surface 12b.

A hollow cylindrical frame 16 made of a metal material such as stainless steel is disposed on an outer circumferential surface of the holding member 12. The frame 16 has an opening 16a (see FIG. 6) defined in an upper portion thereof. The holding member 12 is disposed on the frame 16 in covering relation to the opening 16a. As illustrated in FIGS. 4 and 5, the frame 16 is supported on an X-axis movable table 18. The X-axis movable table 18 includes a horizontal bottom plate 18a that is of an oblong rectangular shape as viewed along the Z-axis. The X-axis movable table 18 also includes a vertical side plate 18b that is of an oblong rectangular shape as viewed along the Y-axis and that has a lower end joined to a front end of the bottom plate 18a in the +Y direction, and a top plate 18c that is of an oblong rectangular shape as viewed along the Z-axis as with the bottom plate 18a and that has a front end joined to an upper end of the side plate 18b.

The top plate 18c is superposed above the bottom plate 18a along the Z-axis. The bottom plate 18a and the top plate 18c jointly define a space 18d therebetween that is open at a rear end thereof in the −Y direction and also at both side ends thereof in the X-axis directions. The bottom plate 18a is slidable on and along a pair of X-axis guide rails 20 disposed below the bottom plate 18a in the −Z direction and extending generally parallel to each other in the X-axis directions. The X-axis guide rails 20 are fixedly mounted on an upper surface of an unillustrated stationary base. An X-axis linear scale 20a is disposed adjacent to and extends along one of the X-axis guide rails 20.

An unillustrated reading head is mounted on a lower surface of the X-axis movable table 18 in facing relation to the X-axis linear scale 20a. When the X-axis movable table 18 moves in one of the X-axis directions along the X-axis guide rails 20, the reading head reads graduations of the X-axis linear scale 20a for the calculation of the position or coordinate along the X-axis of the X-axis movable table 18 and the distance that the X-axis movable table 18 has moved along the X-axis. An unillustrated nut is mounted on a lower surface of the bottom plate 18a of the X-axis movable table 18 and is operatively threaded over a ball screw 22 extending substantially parallel to the X-axis with a plurality of unillustrated balls rollingly interposed therebetween. The ball screw 22 that is rotatable about its central axis is disposed between and extends generally parallel to the X-axis guide rails 20. The ball screw 22 has an end coupled to an electric motor 24 such as a stepping motor.

When the electric motor 24 is energized, it rotates the ball screw 22 about its central axis, causing the nut to move the X-axis movable table 18 in one of the X-axis directions along the X-axis guide rails 20. The X-axis guide rails 20, the ball screw 22, the electric motor 24, etc., jointly make up an X-axis moving mechanism 26 for moving the X-axis movable table 18 along the X-axis guide rails 20. The frame 16 is rotatably supported on an upper surface of the top plate 18c of the X-axis movable table 18 for rotation about a central axis generally parallel to the Z-axis. The frame 16 includes a cylindrical side surface positioned above the top plate 18c and functioning as a pulley portion 16b.

A rotary actuator 30 such as an electric motor is mounted on an outer side surface of the side plate 18b of the X-axis movable table 18. The rotary actuator 30 has a rotational shaft with a pulley 30a mounted thereon. An endless belt 28 is trained around the pulley 30a and the pulley portion 16b. When the rotary actuator 30 is energized, it rotates its rotational shaft, rotating the pulley 30a to move the endless belt 28 and rotate the frame 16 and hence the chuck table 10 about a rotational axis 12g (see FIG. 8A) along the Z-axis, e.g., generally parallel to the Z-axis. By controlling the rotation of the pulley 30a, it is possible to turn the chuck table 10 through a desired angle about the rotational axis 12g. A Y-axis moving mechanism 32 is disposed on an extension of the X-axis moving mechanism 26 along the X-axis.

The Y-axis moving mechanism 32 moves a lower image capturing unit 54 along the Y-axis. The Y-axis moving mechanism 32 includes a pair of Y-axis guide rails 34 extending generally parallel to each other along the Y-axis. The Y-axis guide rails 34 are fixedly mounted on the upper surface of the unillustrated stationary base. A Y-axis movable table 36 is slidably mounted on the Y-axis guide rails 34. An unillustrated nut is mounted on a lower surface of the Y-axis movable table 36 and is operatively threaded over a ball screw 38 extending substantially parallel to the Y-axis with a plurality of unillustrated balls rollingly interposed therebetween. The ball screw 38 that is rotatable about its central axis is disposed between and extends generally parallel to the Y-axis guide rails 34. The ball screw 38 has an end coupled to an electric motor 40 such as a stepping motor. When the electric motor 40 is energized, it rotates the ball screw 38 about its central axis, causing the nut to move the Y-axis movable table 36 in one of the Y-axis directions along the Y-axis guide rails 34. The Y-axis guide rails 34, the ball screw 38, the electric motor 40, etc., jointly make up the Y-axis moving mechanism 32 for moving the Y-axis movable table 36 along the Y-axis guide rails 34.

An unillustrated Y-axis linear scale is disposed adjacent to and extends along one of the Y-axis guide rails 34. An unillustrated reading head is mounted on a lower surface of the Y-axis movable table 36 in facing relation to the Y-axis linear scale. When the Y-axis movable table 36 moves in one of the Y-axis directions along the Y-axis guide rails 34, the reading head reads graduations of the Y-axis linear scale for the calculation of the position or coordinate along the Y-axis of the Y-axis movable table 36 and the distance that the Y-axis movable table 36 has moved along the Y-axis.

Figure 7:
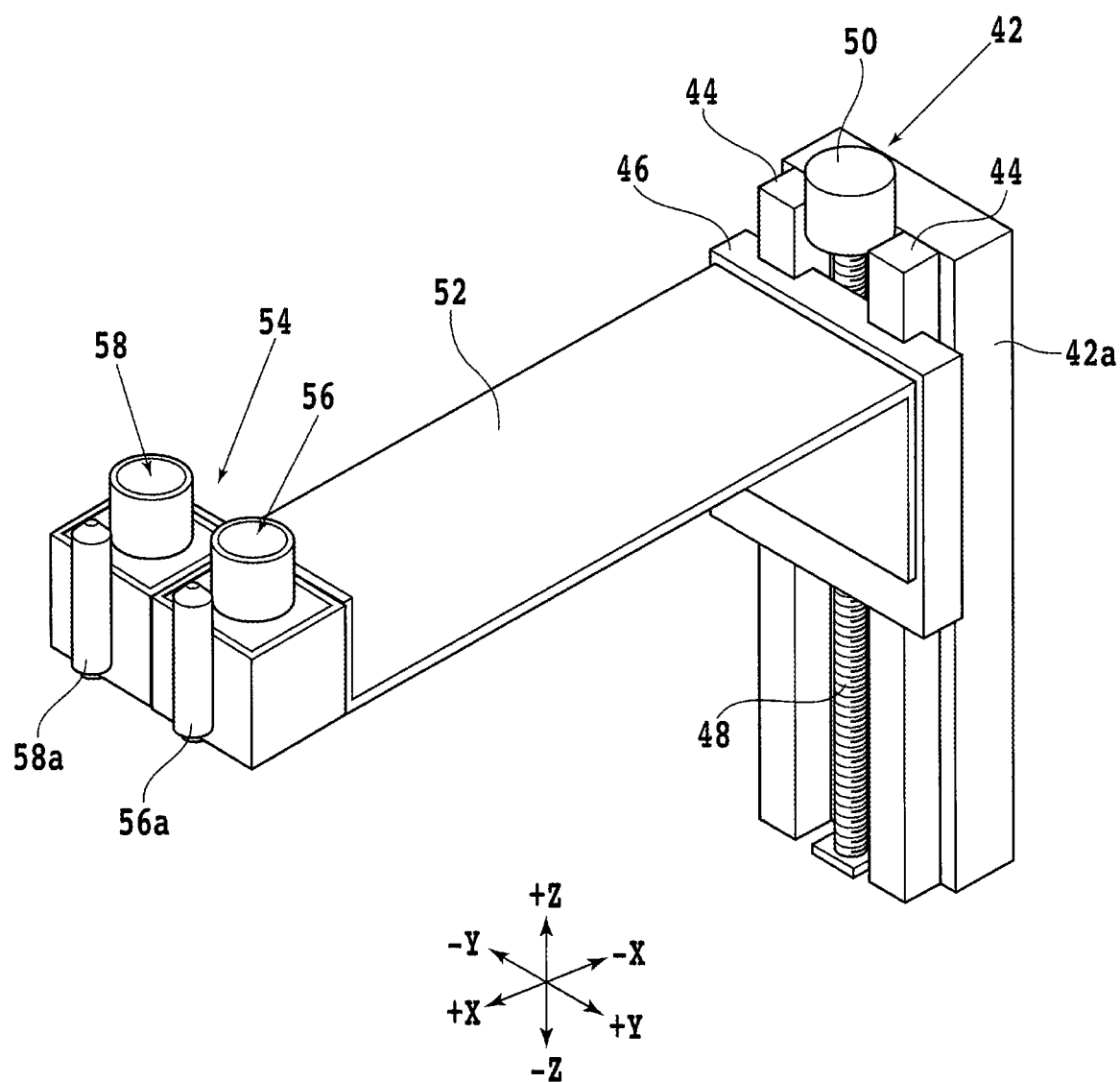
FIG. 7 is an enlarged perspective view of a lower image capturing unit.

A Z-axis moving mechanism 42 is disposed on an upper surface of the Y-axis movable table 36. The Z-axis moving mechanism 42 has a support structure 42a secured to the upper surface of the Y-axis movable table 36. FIG. 7 illustrates the Z-axis moving mechanism 42 and other components in enlarged perspective. As illustrated in FIG. 7, a pair of Z-axis guide rails 44 that extend generally parallel to the Z-axis are secured to a side surface of the support structure 42a that faces the X-axis movable table 18. A Z-axis movable plate 46 is slidably mounted on the Z-axis guide rails 44. An unillustrated nut is mounted on a side surface of the Z-axis movable plate 46 that faces the support structure 42a and is operatively threaded over a ball screw 48 disposed between and extending generally parallel to the Z-axis with a plurality of unillustrated balls rollingly interposed therebetween.

The ball screw 48 has an upper end coupled to an electric motor 50 such as a stepping motor. When the electric motor 50 is energized, it rotates the ball screw 48 about its central axis, causing the nut to move the Z-axis movable plate 46 in one of the Z-axis directions along the Z-axis guide rails 44. The support structure 42a, the Z-axis guide rails 44, the ball screw 48, the electric motor 50, etc., jointly make up the Z-axis moving mechanism 42 for moving the Z-axis movable plate 46 along the Z-axis guide rails 44. An unillustrated Z-axis linear scale is disposed adjacent to and extends along one of the Z-axis guide rails 44. An unillustrated reading head is mounted on the Z-axis movable plate 46 in facing relation to the Z-axis linear scale. When the Z-axis movable plate 46 moves in one of the Z-axis directions along the Z-axis guide rails 44, the reading head reads graduations of the Z-axis linear scale for the calculation of the position or coordinate along the Z-axis of the Z-axis movable plate 46 and the distance that the Z-axis movable plate 46 has moved along the Z-axis.

The lower image capturing unit 54 is secured to the Z-axis movable plate 46 by a support arm 52 that is elongate along the X-axis. As illustrated in FIG. 7, according to the present embodiment, the lower image capturing unit 54 includes a first lower image capturing unit 56 and a second lower image capturing unit 58. Each of the first lower image capturing unit 56 and the second lower image capturing unit 58 is what is generally called a microscopic camera unit. The first lower image capturing unit 56 is a low-magnification camera, and the second lower image capturing unit 58 is a high-magnification camera, for example.

Each of the first lower image capturing unit 56 and the second lower image capturing unit 58 includes an optical system having an unillustrated condensing lens, etc., and an unillustrated image capturing device such as a charge-coupled-device (CCD) image sensor or a complementary-metal-oxide-semiconductor (CMOS) image sensor. According to the present embodiment, the image capturing device is capable of photoelectrically converting visible light into electric signals. The first lower image capturing unit 56 and the second lower image capturing unit 58 are disposed below the other surface 12b of the chuck table 10. The condensing lenses of the first lower image capturing unit 56 and the second lower image capturing unit 58 have their optical axes extending along the Z-axis substantially perpendicularly to the other surface 12b of the holding member 12.

An illuminating device 56a for applying visible light to the workpiece 11 or the like positioned thereabove is disposed alongside of the first lower image capturing unit 56. Similarly, an illuminating device 58a for applying visible light to the workpiece 11 or the like positioned thereabove is disposed alongside of the second lower image capturing unit 58. For capturing an image of the workpiece 11 with the lower image capturing unit 54, the X-axis movable table 18 is moved toward the Y-axis movable table 36 until the lower image capturing unit 54 is placed in the space 18d in the X-axis movable table 18. Then, the lower image capturing unit 54 can capture an image of the face side 11a of the workpiece 11 placed on the surface 12a of the holding member 12 from below the holding member 12.

According to the present embodiment, the reference position of the upper image capturing unit 84a may be positioned in coincident with either the reference position of the first lower image capturing unit 56 or the reference position of the second lower image capturing unit 58. At any rate, the reference positions of the first lower image capturing unit 56 and the second lower image capturing unit 58 are located on the other surface 12b of the holding member 12. The lower image capturing unit 54 has a reference position at the coordinates ($X_{20}$, $Y_{20}$) of a point of intersection between the rotational axis 12g (see FIG. 8A) of the chuck table 10 and the other surface 12b, i.e., at the rotation center on the side of the other surface 12b, for example.

Other components of the cutting apparatus 2 will be described below with reference to FIG. 2 again. Bellows-shaped covers that are flexibly extensible and contractible are disposed in the opening 4b in covering relation thereto on respective left and right sides of the top plate 18c of the X-axis movable table 18 in the +X direction and the −X direction. A portal-shaped support structure 4c is mounted on the upper surface of the base block 4 astride of the opening 4b along the Y-axis. Two processing unit moving mechanisms, i.e., indexing feed units and incising feed units, 60 are disposed on a side surface of the support structure 4c that faces the opening 4a side of the base block 4 in the −X direction. The processing unit moving mechanisms 60 share a pair of Y-axis guide rails 62 fixedly mounted on the side surface of the support structure 4c and extending generally parallel to the Y-axis.

The Y-axis guide rails 62 extend generally parallel to the Y-axis. The processing unit moving mechanisms 60 include respective Y-axis movable plates 64 slidably on and along the Y-axis guide rails 62 independently of each other. Unillustrated nuts are mounted on respective surfaces of the Y-axis movable plates 64 that face the support structure 4c and are operatively threaded over respective ball screws 66 extending substantially parallel to the Y-axis with a plurality of unillustrated balls rollingly interposed therebetween. Specifically, the nut mounted on one of the Y-axis movable plates 64 that is positioned forward in the +Y direction is operatively threaded over one of the ball screws 66, whereas the nut mounted on the other Y-axis movable plate 64 that is positioned rearward in the −Y direction is operatively threaded over the other ball screw 66.

The ball screws 66 have respective ends coupled to respective electric motors 68 such as stepping motors (one of which is illustrated). When the electric motors 68 are energized, they rotate the respective ball screws 66 about their central axes, causing the nuts to move the Y-axis movable plates 64 in the Y-axis directions along the Y-axis guide rails 62. The Y-axis movable plates 64 support on their surfaces facing away from the support structure 4c respective pairs of Z-axis guide rails 72 extending generally parallel to the Z-axis. A Z-axis movable plate 70a has a surface slidable on and along the pair of the Z-axis guide rails 72 on the other surface of the Y-axis movable plate 64 that is positioned rearward in the −Y direction. Similarly, a Z-axis movable plate 70b has a surface slidable on and along the pair of the Z-axis guide rails 72 on the other surface of the Y-axis movable plate 64 that is positioned forward in the +Y direction.

Unillustrated nuts are mounted on respective surfaces of the Z-axis movable plates 70a and 70b that face the support structure 4c, i.e., the Y-axis movable plates 64, and are operatively threaded over respective ball screws 74 with a plurality of unillustrated balls rollingly interposed therebetween. The ball screws 74 extend substantially parallel to the Z-axis and are disposed between the respective pairs of the Z-axis guide rails 72. The ball screws 74 have respective upper ends coupled to respective electric motors 76 such as stepping motors. When the electric motors 76 are energized, they rotate the ball screws 74 about their central axes, causing the nuts to move the Z-axis movable plates 70a and 70b in the Z-axis directions along the Z-axis guide rails 72.

A first cutting unit 78a is mounted on a lower portion of the Z-axis movable plate 70a that is positioned rearward in the −Y direction. The first cutting unit 78a includes a tubular spindle housing 80a that is elongate along the Y-axis. A portion of an unillustrated cylindrical spindle having a longitudinal central axis extending along the Y-axis is rotatably housed in the spindle housing 80a. The spindle has an end coupled to an unillustrated rotary actuator such as an electric motor for rotating the spindle about its central axis.

A first cutting blade 82a having an annular cutting edge is mounted on the other end of the spindle. The first cutting blade 82a according to the present embodiment is of the washer type, i.e., the hubless type, though it may be of the hub type. The upper image capturing unit, i.e., the first image capturing unit, 84a is secured to the lower portion of the Z-axis movable plate 70a near the spindle housing 80a. Hence, the upper image capturing unit 84a is positionally secured with respect to the first cutting unit 78a.

The upper image capturing unit 84a is disposed above the surface 12a of the chuck table 10, i.e., upwardly of the chuck table 10. The upper image capturing unit 84a is what is generally called a microscopic camera unit. The upper image capturing unit 84a includes an optical system having an unillustrated condensing lens, etc., and an unillustrated image capturing device capable of photoelectrically converting visible light into electric signals. The condensing lens has its optical axis substantially perpendicular to the surface 12a of the holding member 12.

Similarly, a second cutting unit 78b is mounted on a lower portion of the Z-axis movable plate 70b that is positioned forward in the +Y direction. The second cutting unit 78b also includes a tubular spindle housing 80b that is elongate along the Y-axis. A portion of an unillustrated cylindrical spindle having a longitudinal central axis extending along the Y-axis is rotatably housed in the spindle housing 80b. The spindle has an end coupled to an unillustrated rotary actuator such as an electric motor for rotating the spindle about its central axis. An unillustrated second cutting blade is mounted on the other end of the spindle. The second cutting blade according to the present embodiment is of the washer type, i.e., the hubless type, though it may be of the hub type.

An upper image capturing unit 84b is secured to the lower portion of the Z-axis movable plate 70b near the spindle housing 80b. The upper image capturing unit 84b is substantially similar in structure to the upper image capturing unit 84a. According to the present embodiment, the upper image capturing unit 84a that is positioned rearward in the −Y direction will also be referred to as the first image capturing unit. According to the present invention, however, the upper image capturing unit 84b that is positioned forward in the +Y direction may be referred to as the first image capturing unit.

The base block 4 also has an upwardly open opening 4d defined therein and positioned behind the opening 4b in the −Y direction. The opening 4d houses therein a cleaning unit 90 for cleaning a workpiece 11, etc., after it has been cut with a cleaning liquid such as pure water.

An unillustrated casing shaped as a rectangular parallelepiped is mounted on the base block 4. A touch panel 92 functioning as both an input panel for the operator to enter instructions and a display panel for displaying information for the operator is mounted on a front side surface of the casing that faces in the +Y direction. The touch panel 92 displays images captured by the upper image capturing units 84a and 84b and the lower image capturing unit 54, for example. Moreover, the touch panel 92 displays processing conditions, a graphical user interface (GUI), etc., in addition to the images captured by the lower image capturing unit 54 and the upper image capturing units 84a and 84b.

The cutting apparatus 2 includes a controller 94 for controlling the touch panel 92, etc. Specifically, the controller 94 controls, in addition to the touch panel 92, the suction source 14, the X-axis moving mechanism 26, the rotary actuator 30, the Y-axis moving mechanism 32, the Z-axis moving mechanism 42, the lower image capturing unit 54, the processing unit moving mechanisms 60, the first cutting unit 78a, the second cutting unit 78b, the upper image capturing units 84a and 84b, etc. The controller 94 is a computer including a processing device such as a processor typified by a central processing unit (CPU) and a storage device 96.

The storage device 96 has a main storage unit such as a dynamic random access memory (DRAM), a static random accessor memory (SRAM), or a read only memory (ROM) and an auxiliary storage unit such as a flash memory, a hard disk drive, or a solid state drive. The auxiliary storage unit stores software including predetermined programs. The controller 94 has its functions performed when the processing device runs the software stored in the auxiliary storage unit. The auxiliary storage unit also stores a predetermined program for performing image processing on images acquired by the lower image capturing unit 54 and the upper image capturing units 84a and 84b.

When the controller 94 performs image processing according to the predetermined program, the controller 94 specifies XY coordinates of a point determined using a predetermined pattern, marks, dust, etc., on the holding member 12 or the workpiece 11 and XY coordinates of the point that has been moved by turning the chuck table 10 through a predetermined angle about the rotational axis 12g. The location to which the point has been moved after the chuck table 10 has been turned may be specified according to an existing pattern matching process, for example.

When the cutting apparatus 2 is to be shipped out of the factory, i.e., when the cutting apparatus 2 has not been used, the respective reference positions of the upper image capturing unit 84a and the lower image capturing unit 54 are preset to the same position on the XY plane. Specifically, the rotation center having the coordinates $(X_{10}, Y_{10})$ (FIG. 8A) on the side of the surface 12a of the holding member 12 is used as the reference position of the upper image capturing unit 84a, and the rotation center having the coordinates $(X_{20}, Y_{20})$ (FIG. 8A) on the other surface 12b of the holding member 12 is used as the reference position of the lower image capturing unit 54, e.g., the first lower image capturing unit 56. On the cutting apparatus 2, since the rotational axis 12g extends parallel to the Z-axis and the surfaces 12a and 12b lie parallel to the XY plane, the rotation center on the surface 12a and the rotation center on the other surface 12b are coincident with each other on the XY plane.

As described above, the chuck table 10 is movable along the X-axis, and the upper image capturing unit 84a and the lower image capturing unit 54 are movable along the Y-axis. The reference positions remain unchanged when the chuck table 10, the upper image capturing unit 84a, and the lower image capturing unit 54 are moved relatively to each other along the X-axis and the Y-axis. In other words, when the chuck table 10, the upper image capturing unit 84a, and the lower image capturing unit 54 are moved relatively to each other along the X-axis and the Y-axis, the reference position in the coordinate system on the surface 12a as viewed from the upper image capturing unit 84a and the reference position in the coordinate system on the other surface 12b as viewed from the lower image capturing unit 54 are coincident with each other on the XY plane.

However, the relative positional relation between the upper image capturing unit 84a and the lower image capturing unit 54 with respect to the chuck table 10 may slightly deviate from the preset positional relation due to the effect of the heat generated when the cutting apparatus 2 is in use. For example, the heat generated in the vicinity of the point where the workpiece 11 is cut, the heat generated when the spindle is rotated at a high speed, and the heat absorbed by cooling water supplied to the point where the workpiece 11 is cut, etc., tend to cause the relative positional relation between the upper image capturing unit 84a and the lower image capturing unit 54 with respect to the chuck table 10 to slightly deviate from a preset positional relation.

If the relative positional relation between the upper image capturing unit 84a and the lower image capturing unit 54 with respect to the chuck table 10 deviates from the preset positional relation, the reference position of the upper image capturing unit 84a and the reference position of the lower image capturing unit 54 deviate from each other on the XY plane.

The positioning method of positioning the reference position of the upper image capturing unit 84a, i.e., the reference position of the first image capturing unit, and the reference position of the first lower image capturing unit 56, i.e., the reference position of the second image capturing unit, will be described below with reference to FIGS. 1 and 8A through 13B. Although the first lower image capturing unit 56 will hereinafter be described as the second image capturing unit for illustrative purposes, the second lower image capturing unit 58 may be used as the second image capturing unit. According to the present embodiment, a reference position means the origin of a coordinate system.

Figure 8A:
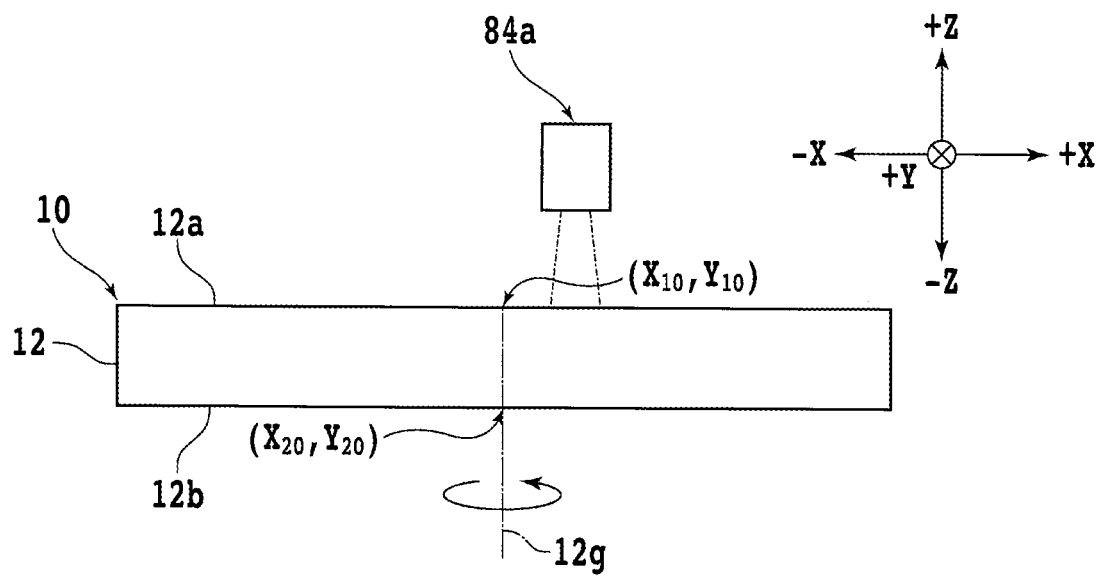
FIG. 8A is a view illustrating a first storing step.
Figure 8B:
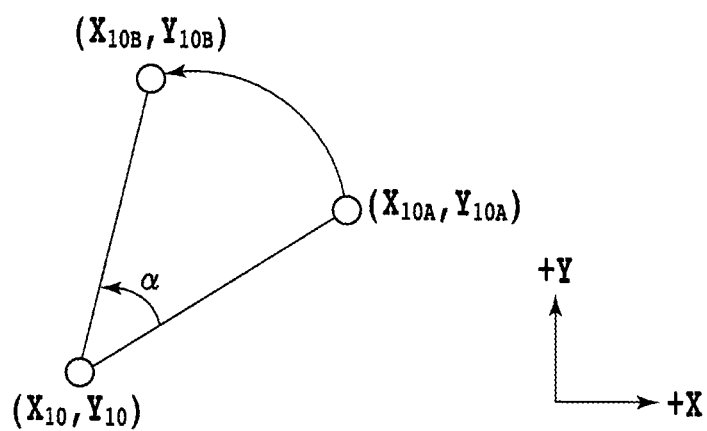
FIG. 8B is a schematic view illustrating a process of detecting the coordinates ($X_{10}$, $Y_{10}$) of a rotation center.

First, the coordinates $(X_{10}, Y_{10})$ of the rotation center on the side of the surface 12a are detected and stored using the upper image capturing unit 84a (first storing step S10). FIG. 8A is a view illustrating the first storing step S10, and FIG. 8B is a schematic view illustrating a process of detecting the coordinates $(X_{10}, Y_{10})$ of the rotation center on the side of the surface 12a. In the first storing step S10, for example, while the surface 12a is being exposed, the coordinates $(X_{10A}, Y_{10A})$ (see FIG. 8B) of a desired point on the side of the surface 12a are determined using the upper image capturing unit 84a.

The coordinates $(X_{10A}, Y_{10A})$ of the desired point should preferably represent a point in an area having a characteristic shape such that they can be captured when the surface 12a is turned about the rotational axis 12g. For example, the coordinates $(X_{10A}, Y_{10A})$ of the desired point represent a point in the first suction channel 12c1, the second suction channel 12c2, the opening 12d, the outer circumferential suction channel 12e, or the like. With the first suction channel 12c1 or the like being used as a landmark, the coordinates ($X_{10A}$, $Y_{10A}$) of the desired point can be determined with use of the existing structure necessary for holding the workpiece 11 under suction, without other landmarks being provided on the surface 12a.

Moreover, since the first suction channel 12c1 or the like can be used as a landmark on the surface 12a without an area that would function as a landmark on the surface 12a but would not contribute to the holding of the workpiece 11 under suction being provided, using the first suction channel 12c1 or the like as a landmark on the surface 12a is advantageous in not reducing the area of the transparent region from the surface 12a to the other surface 12b. According to the present embodiment, the coordinates ($X_{10A}$, $Y_{10A}$) of a desired point on the surface 12a are determined using the upper image capturing unit 84a while the surface 12a is being exposed. However, a point on the reverse side 1ib, i.e., the exposed upper surface, of the workpiece 11 may be used as indicating the coordinates ($X_{10A}$, $Y_{10A}$) of a desired point while the workpiece unit 21 is being held under suction on the surface 12a, i.e., the holding surface.

After the coordinates ($X_{10A}$, $Y_{10A}$) of the desired point have been determined, the chuck table 10 is turned through a predetermined angle α about the rotational axis 12g as illustrated in FIG. 8B. Though the direction in which the chuck table 10 is turned and the angle α are not particularly limited to any direction or angle, the angle α is smaller than 360°, for example. The angle α that is smaller than 360° should preferably, but not necessarily, be either 90°, 180°, or 270°. The angle α being either 90°, 180°, or 270° makes the accuracy of the pattern matching process in image processing higher than the angel α being other angles. This also holds true for angles β, γ, and δ to be described later.

In the example illustrated in FIG. 8B, the coordinates ($X_{10A}$, $Y_{10A}$) of the desired point as they are turned through the angle α about the coordinates ($X_{10}$, $Y_{10}$) of the rotation center are moved to coordinates ($X_{10B}$, $Y_{10B}$). The coordinates ($X_{10A}$, $Y_{10A}$), the coordinates ($X_{10B}$, $Y_{10B}$), and the angle α are known, so that the coordinates ($X_{10}$, $Y_{10}$) are obtained by solving the following equation (1).

[Math. 1]

$$\begin{pmatrix} X_{10B} - X_{10} \\ Y_{10B} - Y_{10} \end{pmatrix} = \begin{pmatrix} \cos\alpha & -\sin\alpha \\ \sin\alpha & \cos\alpha \end{pmatrix} \begin{pmatrix} X_{10A} - X_{10} \\ Y_{10A} - Y_{10} \end{pmatrix} \quad (1)$$

Inasmuch as the thermal effect may possibly vary between the upper image capturing unit 84a and the lower image capturing unit 54 if time is required to search for the coordinates (Xin, Yin) to be obtained after the chuck table 10 has been turned, it is preferable to swiftly specify the coordinates ($X_{10B}$, $Y_{10B}$) after the chuck table has been turned. Consequently, both the coordinates ($X_{10A}$, $Y_{10A}$) and the coordinates ($X_{10B}$, $Y_{10B}$) should preferably be positioned within the image capturing field of view of the upper image capturing unit 84a without the position of the upper image capturing unit 84a being changed before and after the chuck table 10 is turned.

The coordinates ($X_{10}$, $Y_{10}$) are obtained, i.e., detected, by solving the equation (1), and the obtained coordinates ($X_{10}$, $Y_{10}$) are stored in the auxiliary storage unit. The equation (1) is solved by a calculating program stored in the auxiliary storage unit. Equations to be described later are also solved by calculating programs stored in the auxiliary storage unit. However, the rotation center on the surface 12a is not limited to a plane lying flush with the surface 12a. For example, when the workpiece 11 is held under suction on the chuck table 10, the rotation center on the surface 12a is represented by a point positioned above the surface 12a on the rotational axis of the chuck table 10.

Figure 9A:
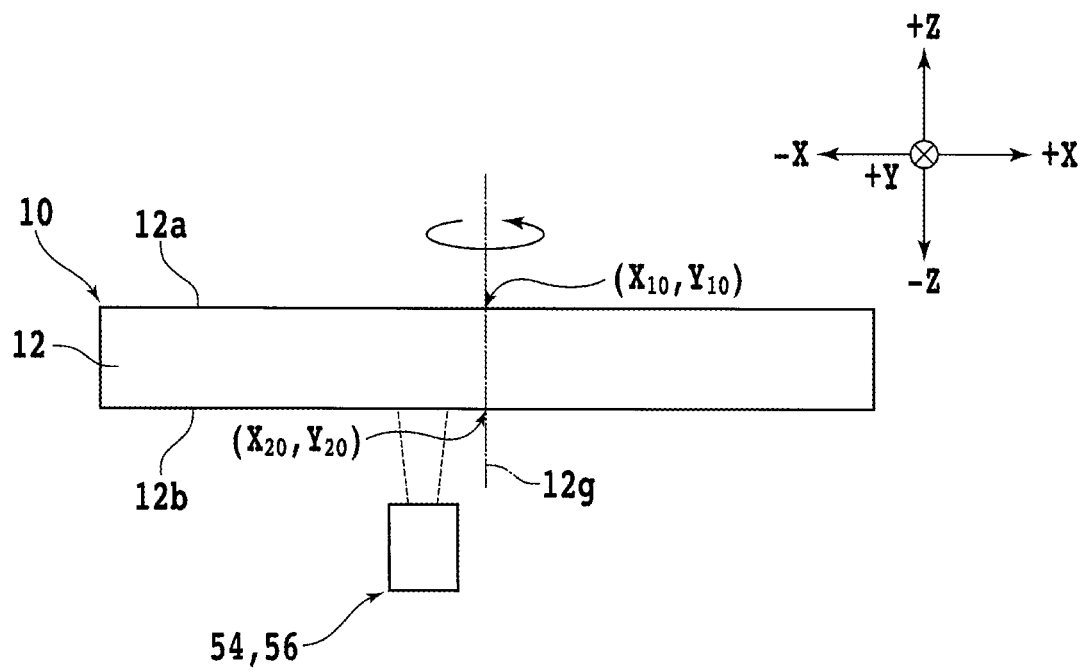
FIG. 9A is a view illustrating a second storing step.
Figure 9B:
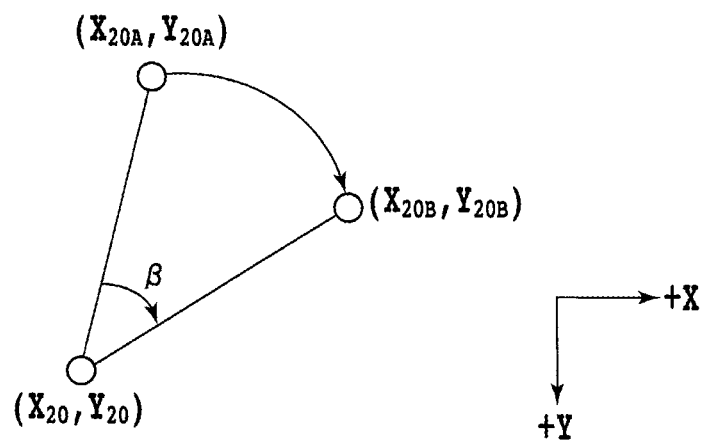
FIG. 9B is a schematic view illustrating a process of detecting the coordinates ($X_{20}$, $Y_{20}$) of a rotation center.

Next, the chuck table 10 is moved along the X-axis until the lower image capturing unit 54 is positioned in the space 18d. Then, the coordinates ($X_{20}$, $Y_{20}$) of the rotation center on the side of the other surface 12b is similarly detected and stored using the first lower image capturing unit 56 (second storing step S12). FIG. 9A is a view illustrating the second storing step S12, and FIG. 9B is a schematic view illustrating a process of detecting the coordinates ($X_{20}$, $Y_{20}$) of the rotation center on the side of the other surface 12b. It is desirable to carry out the second storing step S12 under essentially the same thermal effect as that in the first storing step S10. Hence, the second storing step S12 should be carried out immediately after the first storing step S10 has ended.

According to the present embodiment, in the second storing step S12, while the surface 12a is being exposed, the coordinates ($X_{20A}$, $Y_{20A}$) (see FIG. 9B) of a desired point on the other surface 12b are determined using the first lower image capturing unit 56. The coordinates ($X_{20A}$, $Y_{20A}$) may represent a point positioned below the surface 12a around the rotational axis of the chuck table 10. In other words, the rotation center on the side of the other surface 12b is not limited to the rotation center on a plane lying flush with the other surface 12b. Moreover, when the workpiece unit 21 is held under suction on the surface 12a, i.e., the holding surface, the coordinates ($X_{20A}$, $Y_{20A}$) of a desired point may represent a point on the face side 11a of the workpiece 11. In other words, when the workpiece 11 is held under suction on the chuck table 10, the rotation center on the side of the other surface 12b may be positioned closer to the other surface 12b than the rotation center on the side of the surface 12a that is specified using the upper image capturing unit 84a.

Since the rotational axis 12g extends along the Z-axis, the coordinates ($X_{20}$, $Y_{20}$) of the rotation center on the side of the other surface 12b corresponds to the coordinates ($X_{10}$, $Y_{10}$) of the rotation center on the side of the surface 12a on the XY plane. Specifically, the coordinates ($X_{20}$, $Y_{20}$) and the coordinates ($X_{10}$, $Y_{10}$) are coincident with each other with an accuracy of 1 μm on the XY plane. Stated otherwise, a positional deviation of less than 1 μm is not taken into account in the present embodiment. The coordinates ($X_{20}$, $Y_{20}$) and the coordinates ($X_{10}$, $Y_{10}$) that are obtained by image processing on the image data obtained from the upper image capturing unit 84a and the lower image capturing unit 54 have an accuracy of 1 μm. However, the coordinates ($X_{20}$, $Y_{20}$) and the coordinates ($X_{10}$, $Y_{10}$) may be specified with a higher accuracy. For example, the coordinates can be specified with a higher accuracy using image capturing devices that incorporate a subpixel structure.

In the example illustrated in FIG. 9B, the coordinates ($X_{20A}$, $Y_{20A}$) of the desired point as they are turned through the angle β about the coordinates ($X_{20}$, $Y_{20}$) of the rotation center are moved to coordinates ($X_{20B}$, $Y_{20B}$). The coordinates ($X_{20A}$, $Y_{20A}$), the coordinates ($X_{20B}$, $Y_{20B}$), and the angle β are known, so that the coordinates ($X_{20}$, $Y_{20}$) are obtained by solving the following equation (2).

[Math. 2]

-continued $$\begin{pmatrix} X_{20B} - X_{20} \\ Y_{20B} - Y_{20} \end{pmatrix} = \begin{pmatrix} \cos\beta & -\sin\beta \\ \sin\beta & \cos\beta \end{pmatrix} \begin{pmatrix} X_{20A} - X_{20} \\ Y_{20A} - Y_{20} \end{pmatrix} \quad (2)$$

In the second storing step S12, both the coordinates ($X_{20A}$, $Y_{20A}$) and the coordinates ($X_{20B}$, $Y_{20B}$) should preferably be positioned within the image capturing field of view of the first lower image capturing unit 56 without the position of the first lower image capturing unit 56 being changed before and after the chuck table 10 is turned. The coordinates ($X_{20}$, $Y_{20}$) are obtained, i.e., detected, by solving the equation (2), and the obtained coordinates ($X_{20}$, $Y_{20}$) are stored in the auxiliary storage unit.

The coordinates ($X_{10}$, $Y_{10}$) obtained in the first storing step S10 represent a reference position, i.e., a first reference position, of the upper image capturing unit 84a, and the coordinates ($X_{20}$, $Y_{20}$) obtained in the second storing step S12 represent a reference position, i.e., a second reference position, of the first lower image capturing unit 56. For example, the first storing step S10 and the second storing step S12 are carried out by the manufacturer of the cutting apparatus 2 when the cutting apparatus 2 is to be shipped out of the factory, and the coordinates ($X_{10}$, $Y_{10}$) and the coordinates ($X_{20}$, $Y_{20}$) are set as initial values in the cutting apparatus 2.

Yet, the operator who works for a purchaser of the cutting apparatus 2 and operates the purchased cutting apparatus 2 may instead carry out the first storing step S10 and the second storing step S12. For example, the operator may carry out the first storing step S10 and the second storing step S12 when the chuck table 10 is replaced. While it is preferable to carry out the second storing step S12 immediately after the first storing step S10, as described above, the first storing step S10 and the second storing step S12 may be switched around, and the first storing step S10 may be carried out immediately after the second storing step S12.

After the first storing step S10 and the second storing step S12 have been carried out, the cutting apparatus 2 starts to work. For example, the cutting apparatus 2 starts to cut a plurality of workpieces 11. At this time, due to the effect of the heat generated when the cutting apparatus 2 works, the first reference position may deviate from an original position, and/or the second reference position may deviate from an original position. Specifically, the relative positional relation between the upper image capturing unit 84a and the chuck table 10 may unpredictably deviate on an XY plane, and the relative positional relation between the first lower image capturing unit 56 and the chuck table may unpredictably deviate on an XY plane.

Figure 10A:
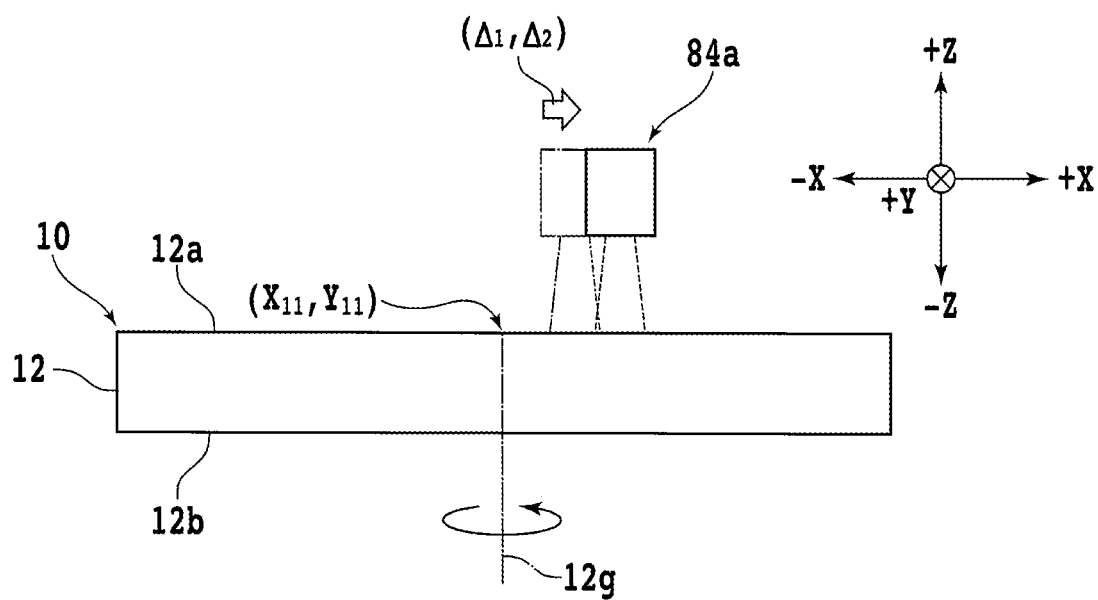
FIG. 10A is a view illustrating a third storing step.
Figure 10B:
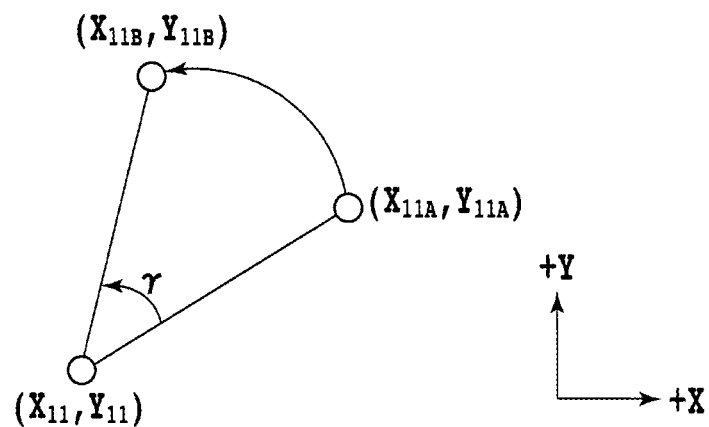
FIG. 10B is a schematic view illustrating a process of detecting the coordinates ($X_{11}$, $Y_{11}$) of a rotation center.

For correcting such positional deviations under the thermal effect, the upper image capturing unit 84a is used to detect the coordinates ($X_{11}$, $Y_{11}$) of a rotation center on the side of the surface 12a, and the detected coordinates ($X_{11}$, $Y_{11}$) are stored as a new first reference position (third storing step S20). FIG. 10A is a view illustrating the third storing step S20, and FIG. 10B is a schematic view illustrating a process of detecting the coordinates ($X_{11}$, $Y_{11}$) of the rotation center. The upper image capturing unit 84a may be relatively moved away from or toward the rotation center of the chuck table 10 due to the thermal effect.

The relative position of the upper image capturing unit 84a with respect to the rotation center may be varied though the distance from the upper image capturing unit 84a to the rotation center remains unchanged. In FIG. 10A, a positional deviation of the upper image capturing unit 84a with respect to the chuck table 10 under the thermal effect is indicated by the outline arrow and ($\Delta_1$, $\Delta_2$). Though the positional deviation is illustrated as being oriented in the +X direction in FIG. 10A, the direction of the positional deviation is not limited to the +X direction.

In the example of the third storing step S20 illustrated in FIG. 10B, the coordinates ($X_{11A}$, $Y_{11A}$) of a desired point as they are turned through the angle $\gamma$ about the coordinates ($X_{11}$, $Y_{11}$) of the rotation center are moved to coordinates ($X_{11B}$, $Y_{11B}$). The coordinates ($X_{11A}$, $Y_{11A}$), the coordinates ($X_{11B}$, $Y_{11B}$), and the angle $\gamma$ are known, so that the coordinates ($X_{11}$, $Y_{11}$) are obtained by solving the following equation (3).

[Math. 3]

$$\begin{pmatrix} X_{11B} - X_{11} \\ Y_{11B} - Y_{11} \end{pmatrix} = \begin{pmatrix} \cos\gamma & -\sin\gamma \\ \sin\gamma & \cos\gamma \end{pmatrix} \begin{pmatrix} X_{11A} - X_{11} \\ Y_{11A} - Y_{11} \end{pmatrix} \quad (3)$$

In the third storing step S20, both the coordinates ($X_{11A}$, $Y_{11A}$) and the coordinates ($X_{11B}$, $Y_{11B}$) should preferably be positioned within the image capturing field of view of the upper image capturing unit 84a without the position of the upper image capturing unit 84a being changed before and after the chuck table 10 is turned. The coordinates ($X_{11}$, $Y_{11}$) are obtained, i.e., detected, by solving the equation (3), and the obtained coordinates ($X_{11}$, $Y_{11}$) are stored in the auxiliary storage unit.

Figure 11A:
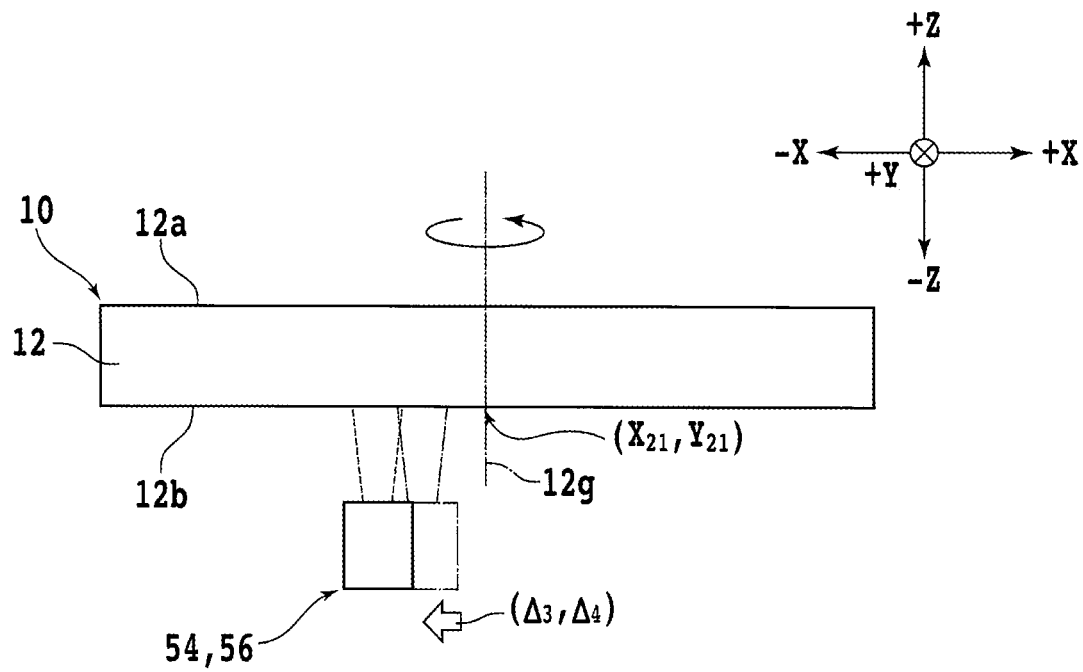
FIG. 11A is a view illustrating a fourth storing step.

Immediately after the third storing step S20, the first lower image capturing unit 56 is used to detect the coordinates ($X_{21}$, $Y_{21}$) of a rotation center on the side of the other surface 12b, and the detected coordinates ($X_{21}$, $Y_{21}$) are stored as a new second reference position (fourth storing step S22). FIG. 11A is a view illustrating the fourth storing step S22, and FIG. 11B is a schematic view illustrating a process of detecting the coordinates ($X_{21}$, $Y_{21}$) of the rotation center.

The first lower image capturing unit 56 may be relatively moved away from or toward the rotation center of the chuck table 10 due to the thermal effect. The relative position of the first lower image capturing unit 56 with respect to the rotation center may be varied though the distance from the first lower image capturing unit 56 to the rotation center remains unchanged. In FIG. 11A, a positional deviation of the first lower image capturing unit 56 with respect to the chuck table 10 under the thermal effect is indicated by the outline arrow and ($\Delta_3$, $\Delta_4$). Though the positional deviation is illustrated as being oriented in the −X direction in FIG. 11A, the direction of the positional deviation is not limited to the −X direction.

Figure 11B:
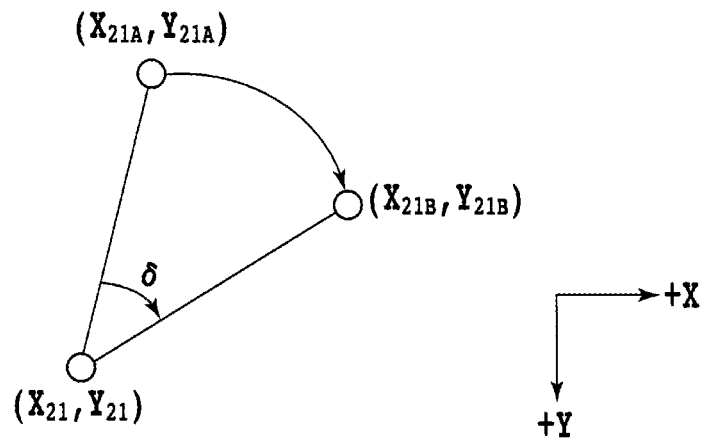
FIG. 11B is a schematic view illustrating a process of detecting the coordinates ($X_{21}$, $Y_{21}$) of a rotation center.

In the example of the fourth storing step S22 illustrated in FIG. 11B, the coordinates ($X_{21A}$, $Y_{21A}$) of a desired point as they are turned through the angle $\delta$ about the coordinates ($X_{21}$, $Y_{21}$) of the rotation center are moved to coordinates ($X_{21B}$, $Y_{21B}$). The coordinates ($X_{21A}$, $Y_{21A}$), the coordinates ($X_{21B}$, $Y_{21B}$), and the angle $\delta$ are known, so that the coordinates ($X_{21}$, $Y_{21}$) are obtained by solving the following equation (4).

[Math. 4]

$$\begin{pmatrix} X_{21B} - X_{21} \\ Y_{21B} - Y_{21} \end{pmatrix} = \begin{pmatrix} \cos\delta & -\sin\delta \\ \sin\delta & \cos\delta \end{pmatrix} \begin{pmatrix} X_{21A} - X_{21} \\ Y_{21A} - Y_{21} \end{pmatrix} \quad (4)$$

In the fourth storing step S22, both the coordinates ($X_{21A}$, $Y_{21A}$) and the coordinates ($X_{21B}$, $Y_{21B}$) should preferably be positioned within the image capturing field of view of the first lower image capturing unit 56 without the position of the first lower image capturing unit 56 being changed before and after the chuck table 10 is turned. The coordinates ($X_{21}$, $Y_{21}$) are obtained, i.e., detected, by solving the equation (4), and the obtained coordinates ($X_{21}$, $Y_{21}$) are stored in the auxiliary storage unit. While it is preferable to carry out the fourth storing step S22 immediately after the third storing step S20, as described above, the third storing step S20 and the fourth storing step S22 may be switched around, and the third storing step S20 may be carried out immediately after the fourth storing step S22.

Figure 12A:
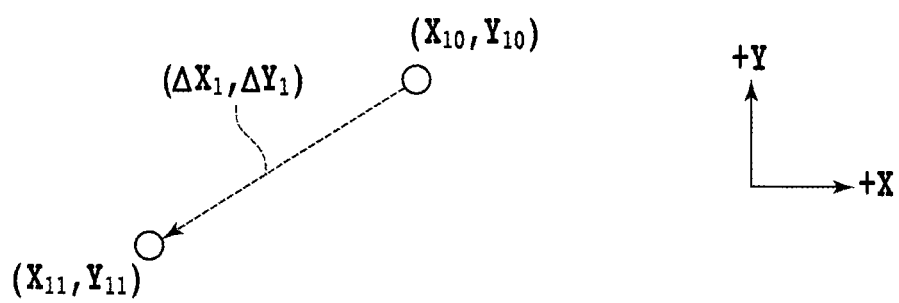
FIG. 12A is a schematic view illustrating a first deviation calculating step.
Figure 12B:
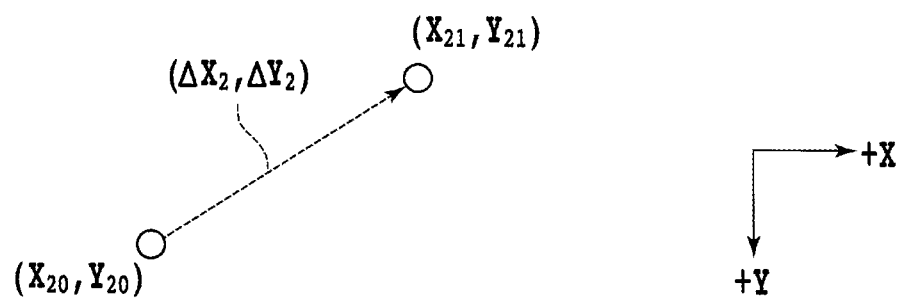
FIG. 12B is a schematic view illustrating a second deviation calculating step.

After the third storing step S20 and the fourth storing step S22, a first deviation ($\Delta X_1$, $\Delta Y_1$) between the coordinates ($X_{10}$, $Y_{10}$) and the coordinates ($X_{11}$, $Y_{11}$) is calculated (first deviation calculating step S30) (see FIG. 12A), and a second deviation ($\Delta X_2$, $\Delta Y_2$) between the coordinates ($X_{20}$, $Y_{20}$) and the coordinates ($X_{21}$, $Y_{21}$) is calculated (second deviation calculating step S32) (see FIG. 12B). FIG. 12A is a schematic view illustrating the first deviation calculating step S30, and FIG. 12B is a schematic view illustrating the second deviation calculating step S32. Whichever of the first deviation calculating step S30 and the second deviation calculating step S32 may be carried out first, or they may be carried out simultaneously.

Figure 13A:
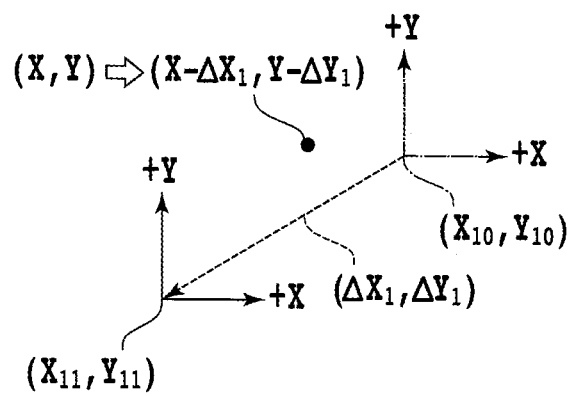
FIG. 13A is a schematic view illustrating a first correcting step.

In the first deviation calculating step S30 and the second deviation calculating step S32, each of the components of the first deviation ($\Delta X_1$, $\Delta Y_1$) and the second deviation ($\Delta X_2$, $\Delta Y_2$) is calculated. In the example illustrated in FIGS. 12A and 12B, $\Delta X_1 = X_{11} - X_{10}$ and $\Delta Y_1 = Y_{11} - Y_{10}$, and similarly $\Delta X_2 = X_{21} - X_{20}$ and $\Delta Y_2 = Y_{21} - Y_{20}$. After the first deviation calculating step S30 and the second deviation calculating step S32, a first correcting step S40 and a second correcting step S42 are carried out. FIG. 13A is a schematic view illustrating the first correcting step S40.

Since the rotation center that has been varied has the coordinates ($X_{11}$, $Y_{11}$), the first reference position of the upper image capturing unit 84a is updated to the coordinates ($X_{11}$, $Y_{11}$), i.e., a new first reference position, in the first correcting step S40. In other words, the coordinates ($X_{11}$, $Y_{11}$) are treated as a new origin. Concurrently, the coordinate system of the image captured by the upper image capturing unit 84a is corrected to eliminate the first deviation ($\Delta X_1$, $\Delta Y_1$). Specifically, (X, Y) at the first reference position, i.e., the old coordinate system, is corrected into (X−$\Delta X_1$, Y−$\Delta Y_1$), i.e., a new coordinate system. In this manner, the coordinate system of the upper image capturing unit 84a is corrected into a coordinate system where the coordinates ($X_{11}$, $Y_{11}$) of the rotation center on the side of the surface 12a represent a reference position.

Figure 13B:
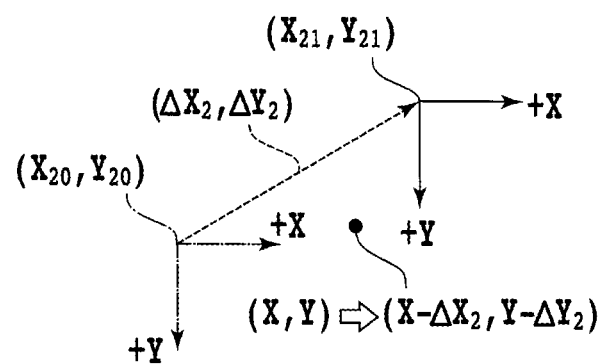
FIG. 13B is a schematic view illustrating a second correcting step.

FIG. 13B is a schematic view illustrating the second correcting step S42. Since the rotation center that has been varied has the coordinates ($X_{21}$, $Y_{21}$), the second reference position of the first lower image capturing unit 56 is updated to the coordinates ($X_{21}$, $Y_{21}$), i.e., a new second reference position, in the second correcting step S42. In other words, the coordinates ($X_{21}$, $Y_{21}$) are treated as a new origin. Concurrently, the coordinate system of the image captured by the first lower image capturing unit 56 is corrected to eliminate the second deviation ($\Delta X_2$, $\Delta Y_2$). Specifically, (X, Y) at the second reference position, i.e., the old coordinate system, is corrected into (X−$\Delta X_2$, Y−$\Delta Y_2$), i.e., a new coordinate system.

In this manner, the coordinate system of the first lower image capturing unit 56 is corrected into a coordinate system where the coordinates ($X_{21}$, $Y_{21}$) of the rotation center on the side of the other surface 12b represent a reference position.

Whichever of the first correcting step S40 and the second correcting step S42 may be carried out first, or they may be carried out simultaneously. The coordinates ($X_{11}$, $Y_{11}$) of the rotation center on the side of the surface 12a and the coordinates ($X_{21}$, $Y_{21}$) of the rotation center on the side of the other surface 12b correspond to each other on an XY plane. Consequently, the deviation on the XY plane between the reference position of the upper image capturing unit 84a and the reference position of the first lower image capturing unit 56 can be reduced. For example, the reference positions can be coincident with each other on the XY plane.

Second Embodiment

It has been described according to the first embodiment that all the steps from the first storing step S10 to the second correcting step S42 are carried out by the operator. However, the coordinates ($X_{10}$, $Y_{10}$) of the rotation center on the side of the surface 12a and the coordinates ($X_{20}$, $Y_{20}$) of the rotation center on the side of the other surface 12b may be stored in advance in the auxiliary storage unit. According to the alternative, the operator of the cutting apparatus 2 can read the stored coordinates ($X_{10}$, $Y_{10}$) and ($X_{20}$, $Y_{20}$) from the auxiliary storage unit and use them.

Figure 14:
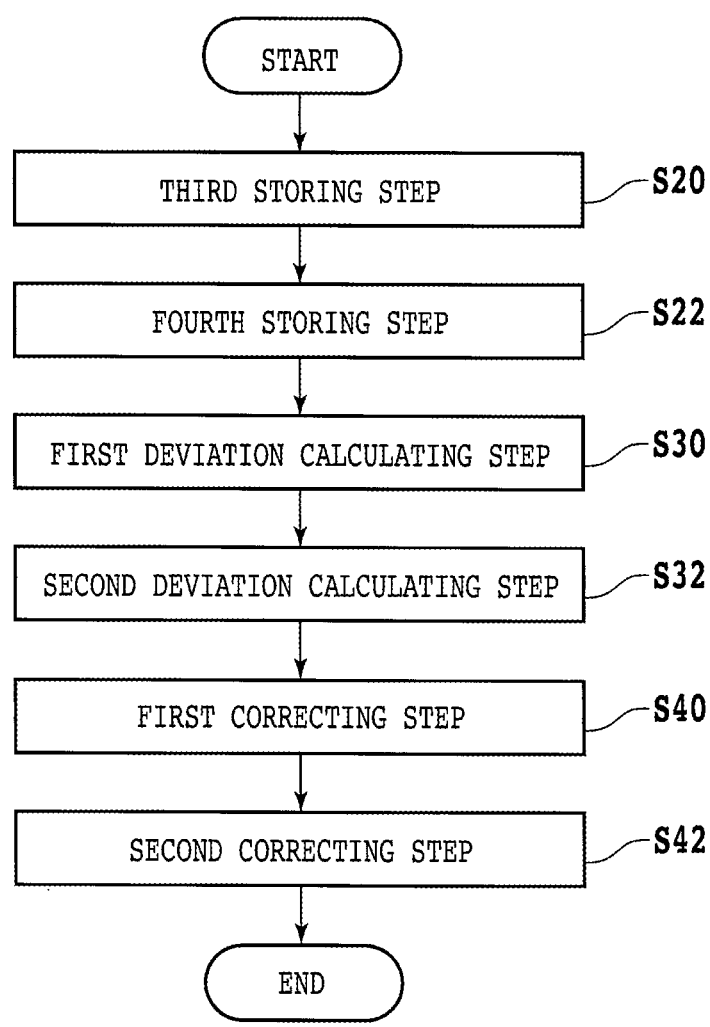
FIG. 14 is a flowchart of a positioning method according to a second embodiment of the present invention.

FIG. 14 is a flowchart of a positioning method according to the second embodiment. The steps from the third storing step S20 to the second correcting step S42 are identical to those according to the first embodiment, and will be omitted from detailed description. According to the second embodiment, the deviation on the XY plane between the reference position of the upper image capturing unit 84a and the reference position of the first lower image capturing unit 56 can be reduced. For example, the reference positions can be coincident with each other on the XY plane.

First Modification

Figure 15:
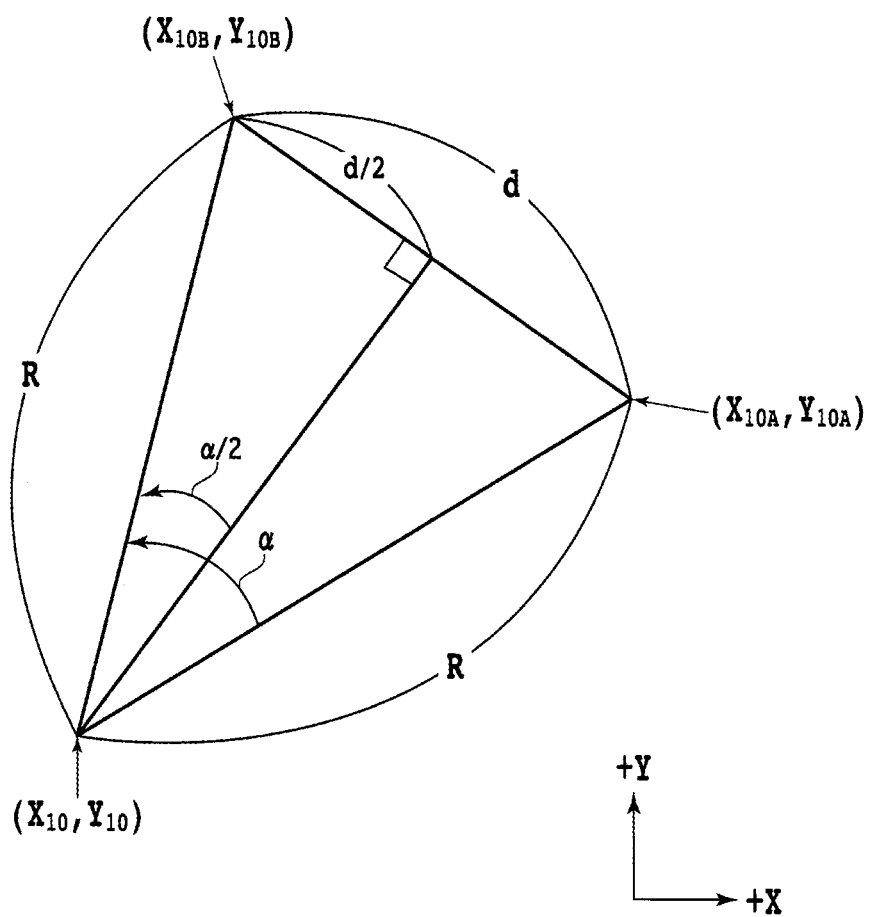
FIG. 15 is a schematic view illustrating a process of detecting the coordinates ($X_{10}$, $Y_{10}$) of a rotation center according to a first modification.

Next, a modification of a process of calculating the coordinates of a rotation center will be described below with reference to FIG. 15. FIG. 15 is a schematic view illustrating a process of detecting the coordinates ($X_{10}$, $Y_{10}$) of a rotation center on the side of the surface 12a in the first storing step S10. According to the first modification, the coordinates ($X_{10}$, $Y_{10}$) of an unknown rotation center are determined in reference to the angle α, the coordinates ($X_{10A}$, $Y_{10A}$), and the coordinates ($X_{10B}$, $Y_{10B}$) that are known. Specifically, the hypotenuse R of a right-angled triangle is calculated according to the following equation (5) where d is expressed by the following equation (6).

[Math. 5]
$$R = \frac{d}{2\sin(\alpha/2)} \quad (5)$$

[Math. 6]
$$d = \sqrt{(X_{10B} - X_{10A})^2 + (Y_{10B} - Y_{10A})^2} \quad (6)$$

Since the following equation (7) is satisfied with respect to a right-angled triangle that includes the coordinates ($X_{10A}$, $Y_{10A}$) and the following equation (8) is satisfied with respect to a right-angled triangle that includes the coordinates ($X_{10B}$, $Y_{10B}$), $X_{10}$ and $Y_{10}$ can be calculated by solving the equations (7) and (8).

[Math. 7]

$$R^2 = (X_{10} - X_{10A})^2 + (Y_{10} - Y_{10A})^2 \quad (7)$$

[Math. 8]

$$R^2 = (X_{10} - X_{10B})^2 + (Y_{10} - Y_{10B})^2 \quad (8)$$

The same calculating process may be applied to the second storing step S12, the third storing step S20, and the fourth storing step S22.

Second Modification

Figure 16:
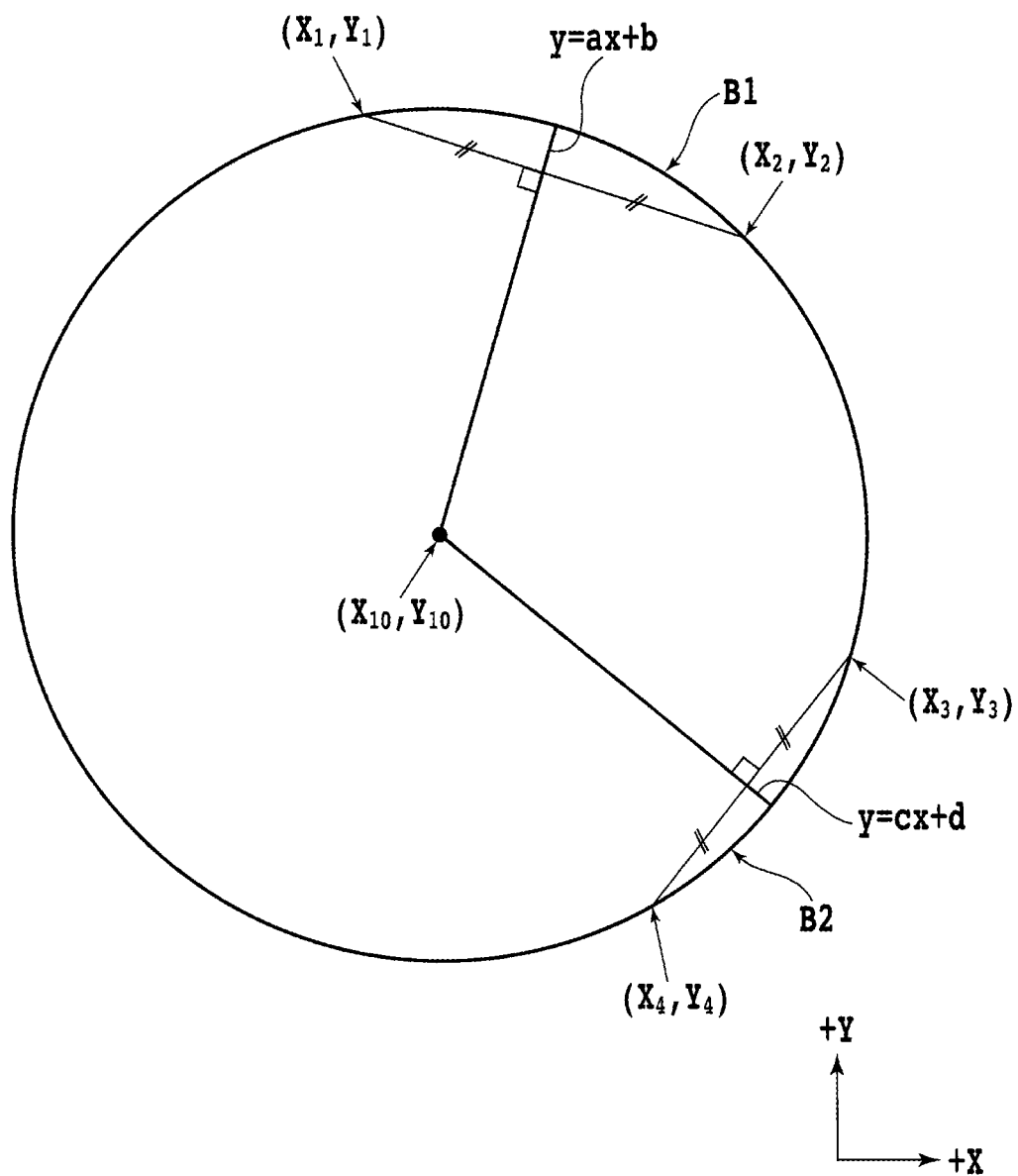
FIG. 16 is a schematic view illustrating a process of detecting the coordinates ($X_{10}$, $Y_{10}$) of a rotation center according to a second modification.

Next, another modification of a process of calculating the coordinates of a rotation center will be described below with reference to FIG. 16. FIG. 16 is a schematic view illustrating a process of detecting the coordinates $(X_{10}, Y_{10})$ of a rotation center on the side of the surface 12a in the first storing step S10. According to the second modification, the shutter speed of the upper image capturing unit 84a is lowered, and the chuck table 10 is rotated about its central axis to make one revolution within the exposure time of the upper image capturing unit 84a. In other words, the angle α is set to 360° or more. Further, the coordinates of the opposite ends of each of an arcuate area B1 and an arcuate area B2 are specified. The range that falls within the field of view of the upper image capturing unit 84a may be an entire circle illustrated in FIG. 16 or an area that includes the arcuate area B1 and the arcuate area B2.

In the example illustrated in FIG. 16, the opposite ends of the arcuate area B1 are represented respectively by coordinates $(X_1, Y_1)$ and coordinates $(X_2, Y_2)$, and the opposite ends of the arcuate area B2 are represented respectively by coordinates $(X_3, Y_3)$ and coordinates $(X_4, Y_4)$. A perpendicular bisector normal to a line segment interconnecting the coordinates $(X_1, Y_1)$ and the coordinates $(X_2, Y_2)$ is expressed by y=ax+b (a and b are constants), whereas a perpendicular bisector normal to a line segment interconnecting the coordinates $(X_3, Y_3)$ and the coordinates $(X_4, Y_4)$ is expressed by y=cx+d (c and d are constants). The coordinates $(X_{10}, Y_{10})$ can be determined by calculating the point of intersection between a straight line represented by y=ax+b and a straight line represented by y=cx+d. The same calculating process may be applied to the second storing step S12, the third storing step S20, and the fourth storing step S22. The first and second modifications may be applied to the detection of the coordinates of the rotation center on the side of the other surface 12b performed with use of the first lower image capturing unit 56.

Third Embodiment

Figure 17:
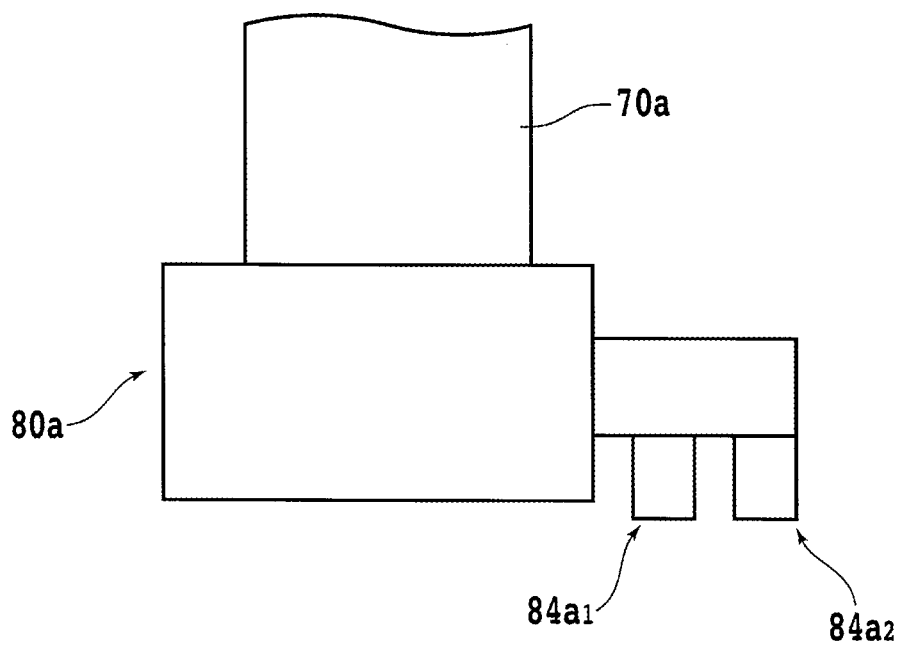
FIG. 17 is a side elevational view illustrating two upper image capturing units according to a third embodiment of the present invention.

Next, a third embodiment will be described below with reference to FIG. 17. According to the third embodiment, a deviation between the respective reference positions of two upper image capturing units $84a_1$ and $84a_2$ that are disposed on the side of the surface 12a, rather than the respective reference positions of the upper image capturing unit 84a and the first lower image capturing unit 56, is reduced, e.g., the reference positions of two upper image capturing units $84a_1$ and $84a_2$ are brought into being coincident with each other. FIG. 17 is a side elevational view illustrating the upper image capturing unit $84a_1$, i.e., a third image capturing unit, and the upper image capturing unit $84a_2$, i.e., a fourth image capturing unit, according to the third embodiment. For illustrative purposes, the first cutting blade 82a, the blade cover, a cutting water nozzle, etc., are omitted from illustration in FIG. 17.

The two upper image capturing units $84a_1$ and $84a_2$ are secured to the spindle housing 80a. The upper image capturing unit $84a_1$ is a high-magnification microscopic camera unit, and the upper image capturing unit $84a_2$ is a low-magnification microscopic camera unit, for example. As described above, the relative positional relation between the two upper image capturing units $84a_1$ and $84a_2$ with respect to the chuck table 10 may slightly deviate from the preset positional relation due to the heat generated when the cutting apparatus 2 is in use.

Figure 18A:
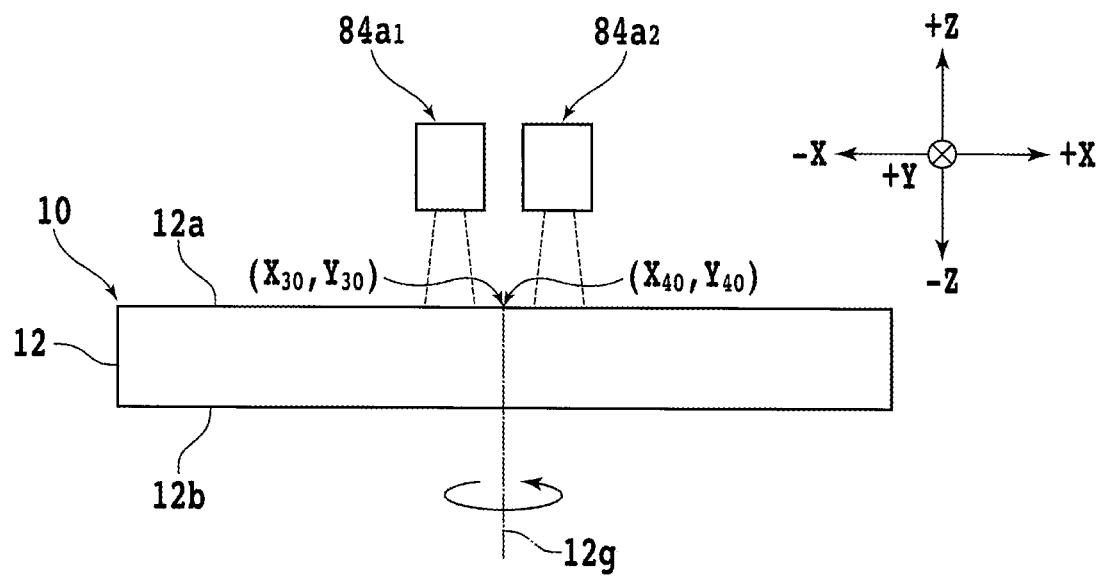
FIG. 18A is a view illustrating a first storing step and a second storing step.

According to the third embodiment, a positioning method is carried out according to the flowchart of FIG. 1. FIG. 18A is a view illustrating the first storing step S10 and the second storing step S12. In the first storing step S10, as in the first embodiment, the coordinates $(X_{30}, Y_{30})$, i.e., a third reference position, of the rotation center on the side of the surface 12a are detected and stored using the upper image capturing unit $84a_1$. In the second storing step S12, as in the first embodiment, the coordinates $(X_{40}, Y_{40})$, i.e., a fourth reference position, of the rotation center on the side of the surface 12a are detected and stored using the upper image capturing unit $84a_2$. In the absence of the effect of the heat, the coordinates $(X_{30}, Y_{30})$ correspond to, e.g., are coincident with, the coordinates $(X_{40}, Y_{40})$.

Figure 18B:
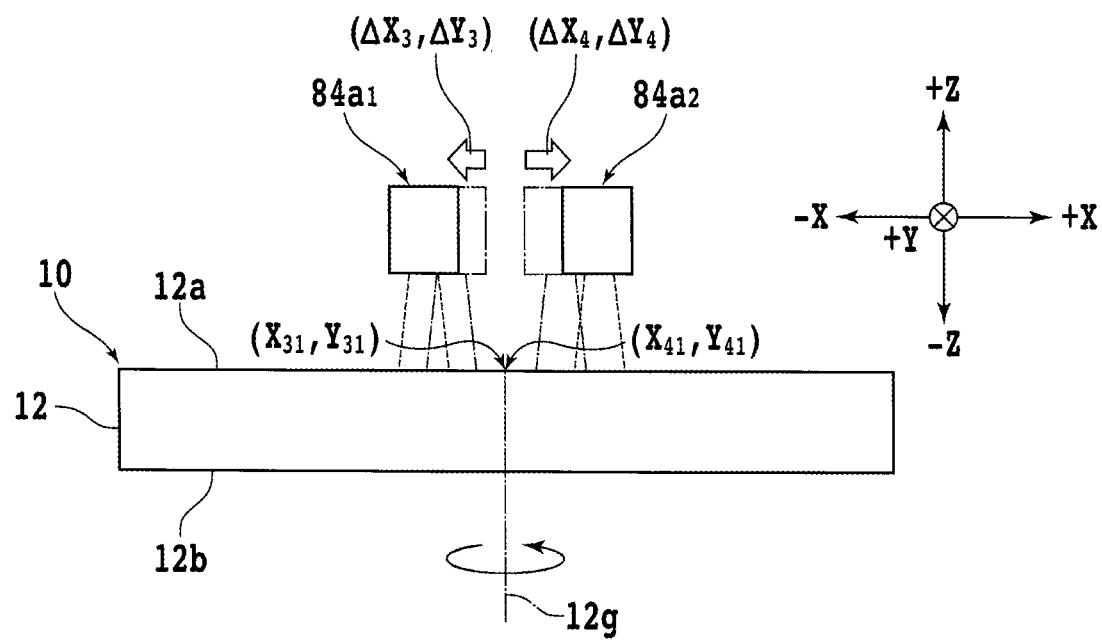
FIG. 18B is a view illustrating a third storing step and a fourth storing step.

After the first storing step S10 and the second storing step S12, the cutting apparatus 2 is actuated. For example, the cutting apparatus 2 cuts a plurality of workpieces 11. At this time, due to the heat generated when the cutting apparatus 2 works, the third reference position as viewed from the upper image capturing unit $84a_1$ may deviate from an original position, and/or the fourth reference position as viewed from the upper image capturing unit $84a_2$ may deviate from an original position. FIG. 18B is a view illustrating the third storing step S20 and the fourth storing step S22 performed after the first storing step S10 and the second storing step S12. In the third storing step S20, as in the first embodiment, the coordinates $(X_{31}, Y_{31})$, i.e., a new third reference position, of the rotation center on the side of the surface 12a are detected and stored using the upper image capturing unit $84a_1$. In the fourth storing step S22, as in the first embodiment, the coordinates $(X_{41}, Y_{41})$, i.e., a new fourth reference position, of the rotation center on the side of the surface 12a are detected and stored using the upper image capturing unit $84a_2$.

After the third storing step S20 and the fourth storing step S22, as in the first embodiment, a first deviation between the coordinates $(X_{30}, Y_{30})$ and the coordinates $(X_{31}, Y_{31})$ is calculated (first deviation calculating step S30), and a second deviation between the coordinates $(X_{40}, Y_{40})$ and the coordinates $(X_{41}, Y_{41})$ is calculated (second deviation calculating step S32). Thereafter, the first deviation between the third reference position and the new third reference position of the upper image capturing unit $84a_1$ is eliminated (first correcting step S40), and the second deviation between the fourth reference position and the new fourth reference position of the upper image capturing unit $84a_2$ is eliminated (second correcting step S42).

The coordinates $(X_{31}, Y_{31})$ and the coordinates $(X_{41}, Y_{41})$ of the rotation center on the side of the surface 12a correspond to each other on the XY plane. Thus, the deviation on the XY plane between the reference positions of the two upper image capturing units $84a_1$ and $84a_2$ can be reduced. For example, their reference positions can be coincident with each other on the XY plane. Rather than or together with the deviation between the respective reference positions of the two upper image capturing units $84a_1$ and $84a_2$, a deviation between the respective reference positions of the first lower image capturing unit, i.e., a third image capturing unit, 56 and the second lower image capturing unit, i.e., a fourth image capturing unit, 58 that are disposed on the side of the other surface 12b of the holding member 12 may be reduced, e.g., their reference positions may be coincident with each other.

Fourth Embodiment

The coordinates ($X_{30}$, $Y_{30}$) and the coordinates ($X_{40}$, $Y_{40}$) of the rotation center may be stored in advance in the auxiliary storage unit. According to the alternative, the operator of the cutting apparatus 2 can read the stored coordinates ($X_{30}$, $Y_{30}$) and ($X_{40}$, $Y_{40}$) from the auxiliary storage unit and use them. According to the fourth embodiment, the steps of the method are carried out according to the flowchart of FIG. 14.

According to the fourth embodiment, a deviation on the XY plane between the respective reference positions of the two upper image capturing units $84a_1$ and $84a_2$ can be reduced. For example, the reference positions can be coincident with each other on the XY plane. As in the third embodiment, a deviation on the XY plane between the respective reference positions of the two upper image capturing units $84a_1$ and $84a_2$ or between the first lower image capturing unit 56 and the second lower image capturing unit 58 may be reduced.

Fifth Embodiment

Figure 19:
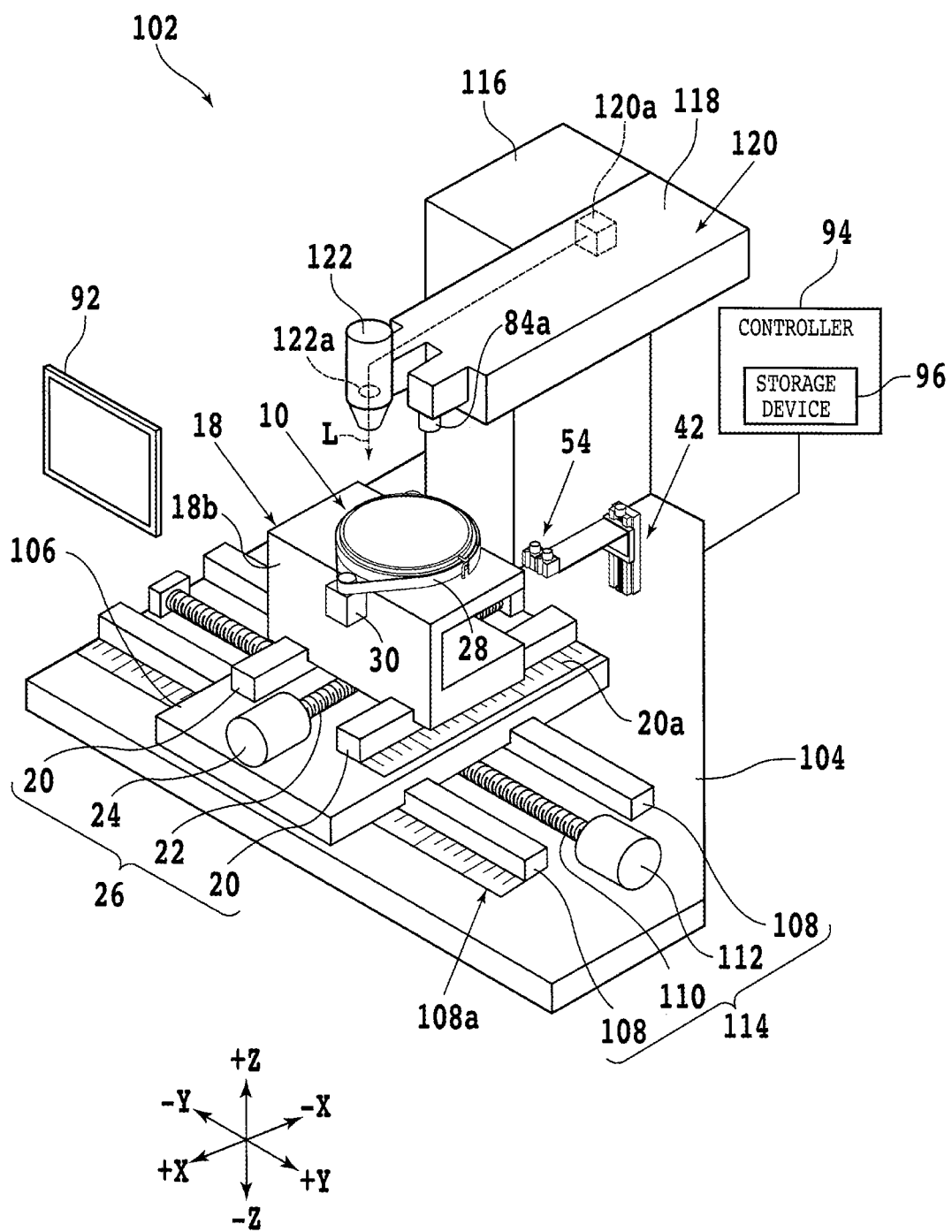
FIG. 19 is a perspective view of a laser processing apparatus according to a fifth embodiment of the present invention.

According to the first through fourth embodiments, the method is carried out using the cutting apparatus 2. However, a laser processing apparatus, i.e., a processing apparatus, 102 (see FIG. 19) may be used instead of the cutting apparatus 2. FIG. 19 is a perspective view of the laser processing apparatus 102 according to the fifth embodiment. Those parts of the laser processing apparatus 102 that are identical to those of the cutting apparatus 2 are denoted by identical reference signs, and their redundant description will be omitted below. The laser processing apparatus 102 includes a stationary base 104 to which the lower image capturing unit 54 is secured. However, the lower image capturing unit 54 may be mounted in such a manner as to be movable along the X-axis or the Y-axis.

The lower image capturing unit 54 according to the present embodiment also includes the first lower image capturing unit 56 and the second lower image capturing unit 58. One of the first lower image capturing unit 56 and the second lower image capturing unit 58 corresponds to the second image capturing unit. The X-axis movable table 18 is disposed above the stationary base 104. The X-axis movable table 18 is arranged such that the lower image capturing unit 54 can enter the space 18d from a region that is positioned opposite the side plate 18b of the X-axis movable table 18.

The X-axis movable table 18 is movable along the X-axis by the X-axis moving mechanism 26. The X-axis guide rails 20 are fixedly mounted on an upper surface of a Y-axis movable table 106. The Y-axis movable table 106 is slidably mounted on a pair of Y-axis guide rails 108 fixedly mounted on an upper surface of the stationary base 104. A Y-axis linear scale 108a for detecting the position of the Y-axis movable table 106 along the Y-axis is disposed adjacent to and extends along one of the Y-axis guide rails 108. An unillustrated nut is mounted on a lower surface of the Y-axis movable table 106.

The nut is operatively threaded over a ball screw 110 extending substantially parallel to the Y-axis with a plurality of unillustrated balls rollingly interposed therebetween. The ball screw 110 that is rotatable about its central axis is disposed between and extends generally parallel to the Y-axis guide rails 108. The ball screw 110 has an end coupled to an electric motor 112. The Y-axis guide rails 108, the ball screw 110, the electric motor 112, etc., jointly make up a Y-axis moving mechanism 114. A column 116 that protrudes upwardly from the upper surface of the stationary base 104 is disposed in a position that is adjacent to the lower image capturing unit 54 in the −Y direction. A casing 118 that is elongate along the X-axis is mounted on the column 116.

A laser beam applying unit 120 has at least some components housed in the casing 118. The laser beam applying unit 120 is capable of applying a pulsed laser beam L having a wavelength of 355 nm, for example, absorbable by the workpiece 11. The components of the laser beam applying unit 120 that are housed in the casing 118 include a laser oscillator 120a for emitting the laser beam L. The laser beam applying unit 120 also includes a head 122 mounted on a distal end thereof in the +X direction. The head 122 includes a condensing lens 122a facing downwardly.

The laser beam emitted from the laser oscillator 120a is focused by the condensing lens 122a and travels downwardly from the head 122, as indicated by the broken-line arrow in FIG. 19. The upper image capturing unit, i.e., the first image capturing unit, 84a is mounted on the distal end of the casing 118 at a position adjacent to the head 122. The positional relation of the upper image capturing unit 84a and the lower image capturing unit 54, e.g., the first lower image capturing unit 56, as illustrated in FIG. 19 is predetermined with respect to the chuck table 10 on the X-axis movable table 18.

In the laser processing apparatus 102, the reference position as viewed from the upper image capturing unit 84a may deviate from an original position, and the reference position as viewed from the first lower image capturing unit 56 may also deviated from an original position, due to the thermal effect as described above. In the laser processing apparatus 102, a deviation on the XY plane between the reference position of the upper image capturing unit 84a and the reference position of the first lower image capturing unit 56 can be reduced according to the positioning method illustrated in FIG. 1 or FIG. 14. For example, these reference positions can be coincident with each other on the XY plane.

The first modification or the second modification or the second through fourth embodiments described above are also applicable to the laser processing apparatus 102. The positioning method according to each of the above embodiments may be carried out at any of the timings (A) through (D) described below, for example. (A) When the processing apparatus is switched on to make itself operational, i.e., started up. (B) When the processing apparatus is serviced for periodical maintenance. (C) Before the first one of a plurality of, e.g., 25, workpieces 11 housed in the cassette 6 is processed. (D) Before each of the workpieces 11 housed in the cassette 6 is processed.

The structures, methods, etc., according to the above embodiments may be changed or modified without departing from the scope of the present invention. For example, the first modification or the second modification is applicable to each of the second through fourth embodiments. The angles α, β, γ, and δ may be different from or identical to each other.

According to another modification, the storing of a reference position by the upper image capturing unit 84a and the storing of a reference position by the first lower image capturing unit 56 or the second lower image capturing unit 58 may be performed simultaneously. For example, the holding member 12 may hold the workpiece 11 under suction on the surface 12a, and the upper image capturing unit 84a may capture an image of the upper surface of the workpiece 11, while, at the same time the first lower image capturing unit 56 may capture an image of the lower surface of the workpiece 11 or the other surface 12b of the holding member 12. At this time, though the upper surface of the workpiece 11 is normally the reverse side 11b, it may be the face side 11a.

Sixth Embodiment

According to the above embodiments, the deviation calculating step and the correcting step are carried out. Before the deviation calculating step and the correcting step are carried out, the cutting apparatus, i.e., the processing apparatus, 2 may update and store the reference positions that vary every moment upon elapse of time. According to this alternative, only the latest reference position is used as a reference position. The controller 94 may leave those reference positions that are not the latest as log data in the storage device 96 or may discard the reference positions that are not the latest.

Figure 20:
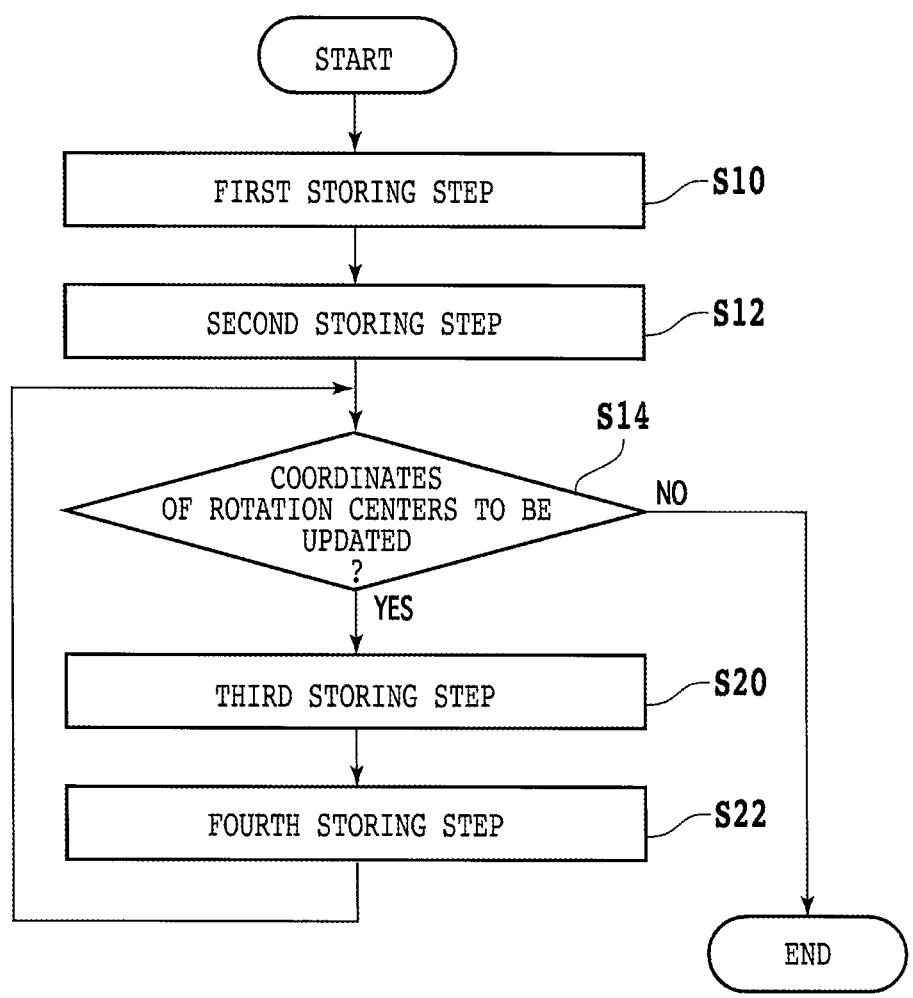
FIG. 20 is a flowchart of a method of updating reference positions according to a sixth embodiment of the present invention.

FIG. 20 is a flowchart of a method of updating reference positions according to the sixth embodiment. According to the sixth embodiment, the coordinates $(X_{10}, Y_{10})$ of the rotation center on the side of the surface 12a are stored as a first reference position in the first storing step S10. The coordinates $(X_{10}, Y_{10})$ may be of initial values set in the cutting apparatus 2 as described above or may be of values obtained at any timing after being subjected to the thermal effect.

Similarly, the coordinates $(X_{20}, Y_{20})$ of the rotation center on the side of the other surface 12b are stored as a second reference position in the second storing step S12. The coordinates $(X_{20}, Y_{20})$ may be of initial values set in the cutting apparatus 2 as described above or may be of values obtained at any timing after being subjected to the thermal effect.

The coordinates $(X_{20}, Y_{20})$ are obtained when the first lower image capturing unit, i.e., the second image capturing unit, 56 captures an image of the other surface 12b immediately after or before the upper image capturing unit, i.e., the first image capturing unit, 84a captures an image of the surface 12a in order to obtain the coordinates $(X_{10}, Y_{10})$. Hence, the thermal effect on the upper image capturing unit 84a and the thermal effect on the first lower image capturing unit 56 are essentially equal to each other. The upper image capturing unit 84b may be used instead of the upper image capturing unit 84a, and the second lower image capturing unit 58 may be used instead of the first lower image capturing unit 56.

As illustrated in FIG. 20, if the coordinates of the rotation centers of the surface 12a and the other surface 12b are to be updated (YES in S14), then the third storing step S20 and the fourth storing step S22 are carried out. Immediately after the third storing step S20 is ended, the fourth storing step S22 is carried out. However, the order of these steps may be changed, and the third storing step S20 may be carried out immediately after the fourth storing step S22 is ended. In the third storing step S20, the coordinates $(X_{11}, Y_{11})$ of a rotation center on the side of the surface 12a are detected, and the coordinates $(X_{10}, Y_{10})$ are updated into the coordinates $(X_{11}, Y_{11})$ and stored as a first reference position.

In the fourth storing step S22, similarly, the coordinates $(X_{21}, Y_{21})$ of a rotation center on the side of the other surface 12b are detected, and the coordinates $(X_{20}, Y_{20})$ are updated into the coordinates $(X_{21}, Y_{21})$ and stored as a second reference position. The reference positions may be updated any number of times. If the coordinates of the rotation centers of the surface 12a and the other surface 12b are not to be updated (NO in S14), then the sequence of the updating method comes to an end. As the coordinates $(X_{11}, Y_{11})$ and the coordinates $(X_{21}, Y_{21})$ correspond to, e.g., are coincident with, each other on the XY plane, even if the relative positional relation between the upper image capturing unit 84a and the first lower image capturing unit 56 deviates, the deviation on the XY plane between the reference positions of the upper image capturing unit 84a and the first lower image capturing unit 56 can be reduced when the old reference positions are updated into the new reference positions.

Seventh Embodiment

A seventh embodiment is different from the sixth embodiment in that the reference positions of the upper image capturing unit, i.e., the third image capturing unit, $84a_1$ and the upper image capturing unit, i.e., the fourth image capturing unit, $84a_2$ are updated according to the flowchart of FIG. 20. The coordinates $(X_{30}, Y_{30})$ and the coordinates $(X_{40}, Y_{40})$ may be of initial values set in the cutting apparatus 2 as described above or may be of values obtained at any timing after being subjected to the thermal effect.

In the third storing step S20, the coordinates $(X_{31}, Y_{31})$ of a rotation center on the side of the surface 12a are detected, and the coordinates $(X_{30}, Y_{30})$ are updated into the coordinates $(X_{31}, Y_{31})$ that are stored as a third reference position. In the fourth storing step S22, similarly, the coordinates $(X_{41}, Y_{41})$ of a rotation center on the side of the surface 12a are detected, and the coordinates $(X_{40}, Y_{40})$ are updated into the coordinates $(X_{41}, Y_{41})$ that are stored as a fourth reference position. The reference positions may be updated any number of times. If the coordinates of the rotation centers are not to be updated (NO in S14), then the sequence of the updating method comes to an end.

As the coordinates $(X_{31}, Y_{31})$ and the coordinates $(X_{41}, Y_{41})$ correspond to, e.g., are coincident with, each other on the XY plane, even if the relative positional relation between the upper image capturing unit $84a_1$ and the upper image capturing unit $84a_2$ deviates, the deviation on the XY plane between the reference positions of the upper image capturing unit $84a_1$ and the upper image capturing unit $84a_2$ can be reduced when the old reference positions are updated into the new reference positions. Alternatively, the reference positions of the first lower image capturing unit, i.e., the third image capturing unit, 56 and the second lower image capturing unit, i.e., the fourth image capturing unit, 58 that are positioned on the side of the other surface 12b may be updated according to the flowchart of FIG. 20.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A positioning method of positioning a reference position of a first image capturing unit and a reference position of a second image capturing unit with respect to each other in a processing apparatus, the processing apparatus including a holding table that has a region made of a transparent material and that is capable of holding a workpiece under suction thereon, the holding table being rotatable about a predetermined rotational axis, the first image capturing unit disposed on the side of a surface of the holding table, and the second image capturing unit disposed on the side of another surface of the holding table, the rotational axis extending along a Z-axis perpendicular to an XY plane, the positioning method comprising:

a first storing step of detecting coordinates $(X_{10}, Y_{10})$ of a rotation center on the side of the surface of the holding table with the first image capturing unit and storing the detected coordinates as a first reference position;

a second storing step of detecting coordinates $(X_{20}, Y_{20})$ of a rotation center on the side of the other surface of the holding table, the coordinates $(X_{20}, Y_{20})$ corresponding to the coordinates $(X_{10}, Y_{10})$ on the XY plane, with the second image capturing unit and storing the detected coordinates as a second reference position;

after the first storing step and the second storing step, a third storing step of detecting coordinates $(X_{11}, Y_{11})$ of a rotation center on the side of the surface of the holding table with the first image capturing unit and storing the detected coordinates as a new first reference position;

after the first storing step and the second storing step, a fourth storing step of detecting coordinates $(X_{21}, Y_{21})$ of a rotation center on the side of the other surface of the holding table with the second image capturing unit and storing the detected coordinates as a new second reference position;

after the third storing step and the fourth storing step, a first deviation calculating step of calculating a first deviation between the coordinates $(X_{10}, Y_{10})$ and the coordinates $(X_{11}, Y_{11})$;

after the third storing step and the fourth storing step, a second deviation calculating step of calculating a second deviation between the coordinates $(X_{20}, Y_{20})$ and the coordinates $(X_{21}, Y_{21})$;

a first correcting step of correcting a coordinate system of images captured by the first image capturing unit, in order to eliminate the first deviation; and a second correcting step of correcting a coordinate system of images captured by the second image capturing unit, in order to eliminate the second deviation.

2. A positioning method of positioning a reference position of a first image capturing unit and a reference position of a second image capturing unit with respect to each other in a processing apparatus, the processing apparatus including a holding table that has a region made of a transparent material and that is capable of holding a workpiece under suction thereon, the holding table being rotatable about a predetermined rotational axis, the first image capturing unit disposed on the side of a surface of the holding table, and the second image capturing unit disposed on the side of another surface of the holding table, the rotational axis extending along a Z-axis perpendicular to an XY plane, the positioning method comprising:

a third storing step of detecting coordinates $(X_{11}, Y_{11})$ of a rotation center on the side of the surface of the holding table with the first image capturing unit and storing the detected coordinates as a new first reference position;

a fourth storing step of detecting coordinates $(X_{21}, Y_{21})$ of a rotation center on the side of the other surface of the holding table with the second image capturing unit and storing the detected coordinates as a new second reference position;

after the third storing step and the fourth storing step, a first deviation calculating step of calculating a first deviation between coordinates $(X_{10}, Y_{10})$ of a rotation center on the side of the surface of the holding table that have been detected with the first image capturing unit and stored in advance as a first reference position in the processing apparatus and the coordinates $(X_{11}, Y_{11})$;

after the third storing step and the fourth storing step, a second deviation calculating step of calculating a second deviation between coordinates $(X_{20}, Y_{20})$ of a rotation center on the side of the other surface of the holding table that have been detected with the second image capturing unit and stored in advance as a second reference position in the processing apparatus, the coordinates $(X_{20}, Y_{20})$ corresponding to the coordinates $(X_{10}, Y_{10})$ on the XY plane, and the coordinates $(X_{21}, Y_{21})$;

a first correcting step of correcting a coordinate system of images captured by the first image capturing unit, in order to eliminate the first deviation; and a second correcting step of correcting a coordinate system of images captured by the second image capturing unit, in order to eliminate the second deviation.

3. A positioning method of positioning a reference position of a third image capturing unit and a reference position of a fourth image capturing unit with respect to each other in a processing apparatus, the processing apparatus including a holding table that has a region made of a transparent material and that is capable of holding a workpiece under suction thereon, the holding table being rotatable about a predetermined rotational axis, and the third and fourth image capturing units disposed on the side of a surface of the holding table in thicknesswise directions of the holding table, the rotational axis extending along a Z-axis perpendicular to an XY plane, the positioning method comprising:

a first storing step of detecting coordinates $(X_{30}, Y_{30})$ of a rotation center on the side of the surface of the holding table with the third image capturing unit and storing the detected coordinates as a third reference position;

a second storing step of detecting coordinates $(X_{40}, Y_{40})$ of a rotation center on the side of the surface of the holding table, the coordinates $(X_{40}, Y_{40})$ corresponding to the coordinates $(X_{30}, Y_{30})$ on the XY plane, with the fourth image capturing unit and storing the detected coordinates as a fourth reference position;

after the first storing step and the second storing step, a third storing step of detecting coordinates $(X_{31}, Y_{31})$ of a rotation center on the side of the surface of the holding table with the third image capturing unit and storing the detected coordinates as a new third reference position;

after the first storing step and the second storing step, a fourth storing step of detecting coordinates $(X_{41}, Y_{41})$ of a rotation center on the side of the surface of the holding table with the fourth image capturing unit and storing the detected coordinates as a new fourth reference position;

after the third storing step and the fourth storing step, a first deviation calculating step of calculating a first deviation between the coordinates ($X_{30}$, $Y_{30}$) and the coordinates ($X_{31}$, $Y_{31}$);

after the third storing step and the fourth storing step, a second deviation calculating step of calculating a second deviation between the coordinates ($X_{40}$, $Y_{40}$) and the coordinates ($X_{41}$, $Y_{41}$);

a first correcting step of correcting a coordinate system of images captured by the third image capturing unit, in order to eliminate the first deviation; and a second correcting step of correcting a coordinate system of images captured by the fourth image capturing unit, in order to eliminate the second deviation.

4. A positioning method of positioning a reference position of a third image capturing unit and a reference position of a fourth image capturing unit with respect to each other in a processing apparatus, the processing apparatus including a holding table that has a region made of a transparent material and that is capable of holding a workpiece under suction thereon, the holding table being rotatable about a predetermined rotational axis, and the third and fourth image capturing units disposed on the side of a surface of the holding table in thicknesswise directions of the holding table, the rotational axis extending along a Z-axis perpendicular to an XY plane, the positioning method comprising:

a third storing step of detecting coordinates ($X_{31}$, $Y_{31}$) of a rotation center on the side of the surface of the holding table with the third image capturing unit and storing the detected coordinates as a new third reference position;

a fourth storing step of detecting coordinates ($X_{41}$, $Y_{41}$) of a rotation center on the side of the surface of the holding table with the fourth image capturing unit and storing the detected coordinates as a new fourth reference position;

after the third storing step and the fourth storing step, a first deviation calculating step of calculating a first deviation between coordinates ($X_{30}$, $Y_{30}$) of a rotation center on the side of the surface of the holding table that have been detected with the third image capturing unit and stored in advance as a third reference position in the processing apparatus and the coordinates ($X_{31}$, $Y_{31}$);

after the third storing step and the fourth storing step, a second deviation calculating step of calculating a second deviation between coordinates ($X_{40}$, $Y_{40}$) of a rotation center on the side of the surface of the holding table that have been detected with the fourth image capturing unit and stored in advance as a fourth reference position in the processing apparatus, the coordinates ($X_{40}$, $Y_{40}$) corresponding to the coordinates ($X_{30}$, $Y_{30}$) on the XY plane, and the coordinates ($X_{41}$, $Y_{41}$);

a first correcting step of correcting a coordinate system of images captured by the third image capturing unit, in order to eliminate the first deviation; and a second correcting step of correcting a coordinate system of images captured by the fourth image capturing unit, in order to eliminate the second deviation.

5. An updating method of updating a reference position of a first image capturing unit and a reference position of a second image capturing unit in a processing apparatus, the processing apparatus including a holding table that has a region made of a transparent material and that is capable of holding a workpiece under suction thereon, the holding table being rotatable about a predetermined rotational axis, the first image capturing unit disposed on the side of a surface of the holding table, and the second image capturing unit disposed on the side of another surface of the holding table, the rotational axis extending along a Z-axis perpendicular to an XY plane, the updating method comprising:

a first storing step of detecting coordinates ($X_{10}$, $Y_{10}$) of a rotation center on the side of the surface of the holding table with the first image capturing unit and storing the detected coordinates as a first reference position;

a second storing step of detecting coordinates ($X_{20}$, $Y_{20}$) of a rotation center on the side of the other surface of the holding table, the coordinates ($X_{20}$, $Y_{20}$) corresponding to the coordinates ($X_{10}$, $Y_{10}$) on the XY plane, with the second image capturing unit and storing the detected coordinates as a second reference position;

after the first storing step and the second storing step, a third storing step of detecting coordinates ($X_{11}$, $Y_{11}$) of a rotation center on the side of the surface of the holding table with the first image capturing unit, updating the coordinates ($X_{10}$, $Y_{10}$) into the coordinates ($X_{11}$, $Y_{11}$), and storing the coordinates ($X_{11}$, $Y_{11}$) as the first reference position; and after the first storing step and the second storing step, a fourth storing step of detecting coordinates ($X_{21}$, $Y_{21}$) of a rotation center on the side of the other surface of the holding table with the second image capturing unit, updating the coordinates ($X_{20}$, $Y_{20}$) into the coordinates ($X_{21}$, $Y_{21}$), and storing the coordinates ($X_{21}$, $Y_{21}$) as the second reference position.

6. An updating method of updating a reference position of a third image capturing unit and a reference position of a fourth image capturing unit in a processing apparatus, the processing apparatus including a holding table that has a region made of a transparent material and that is capable of holding a workpiece under suction thereon, the holding table being rotatable about a predetermined rotational axis, and the third and fourth image capturing units disposed on the side of a surface of the holding table in thicknesswise directions of the holding table, the rotational axis extending along a Z-axis perpendicular to an XY plane, the updating method comprising:

a first storing step of detecting coordinates ($X_{30}$, $Y_{30}$) of a rotation center on the side of the surface of the holding table with the third image capturing unit and storing the detected coordinates as a third reference position;

a second storing step of detecting coordinates ($X_{40}$, $Y_{40}$) of a rotation center on the side of the surface of the holding table, the coordinates ($X_{40}$, $Y_{40}$) corresponding to the coordinates ($X_{30}$, $Y_{30}$) on the XY plane, with the fourth image capturing unit and storing the detected coordinates as a fourth reference position;

after the first storing step and the second storing step, a third storing step of detecting coordinates ($X_{31}$, $Y_{31}$) of a rotation center on the side of the surface of the holding table with the third image capturing unit, updating the coordinates ($X_{30}$, $Y_{30}$) into the coordinates ($X_{31}$, $Y_{31}$), and storing the coordinates ($X_{31}$, $Y_{31}$) as the third reference position; and after the first storing step and the second storing step, a fourth storing step of detecting coordinates ($X_{41}$, $Y_{41}$) of a rotation center on the side of the surface of the holding table with the fourth image capturing unit, updating the coordinates $(X_{40}, Y_{40})$ into the coordinates $(X_{41}, Y_{41})$, and storing the coordinates $(X_{41}, Y_{41})$ as the fourth reference position.

\* \* \* \* \*